United States Patent
Ishikawa et al.

(10) Patent No.: US 10,194,548 B2
(45) Date of Patent: Jan. 29, 2019

(54) ELECTRONIC CONTROL DEVICE

(71) Applicant: Hitachi Automotive Systems, Ltd., Hitachinaka-shi, Ibaraki (JP)

(72) Inventors: Shoho Ishikawa, Hitachinaka (JP); Yoshio Kawai, Hitachinaka (JP); Masato Saitou, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/505,278

(22) PCT Filed: Aug. 5, 2015

(86) PCT No.: PCT/JP2015/072159
§ 371 (c)(1),
(2) Date: Feb. 21, 2017

(87) PCT Pub. No.: WO2016/031511
PCT Pub. Date: Mar. 3, 2016

(65) Prior Publication Data
US 2017/0257964 A1    Sep. 7, 2017

(30) Foreign Application Priority Data
Aug. 29, 2014 (JP) ................................. 2014-174895

(51) Int. Cl.
*H05K 5/00* (2006.01)
*H05K 5/06* (2006.01)
*F02N 11/08* (2006.01)

(52) U.S. Cl.
CPC ........... *H05K 5/065* (2013.01); *H05K 5/0017* (2013.01); *H05K 5/0047* (2013.01);
(Continued)

(58) Field of Classification Search
CPC .... H05K 5/065; H05K 5/0017; H05K 5/0073; H05K 5/061; H05K 5/062; H02G 3/08;
(Continued)

(56) References Cited

U.S. PATENT DOCUMENTS 4,298,204 A * 11/1981 Jinkins ................... F16J 15/062
                                                                      277/641
6,455,768 B2 * 9/2002 Negishi .................. H05K 5/061
                                                                      174/50
(Continued)

FOREIGN PATENT DOCUMENTS

JP      58-184880 U    12/1983
JP       5-147113 A     6/1993
(Continued)

OTHER PUBLICATIONS

International Search Report (PCT/ISA/210) issued in PCT Application No. PCT/JP2015/072159 dated Nov. 24, 2015 with English translation (Two (2) pages).
(Continued)

*Primary Examiner* — Angel R Estrada
(74) *Attorney, Agent, or Firm* — Crowell & Moring LLP

(57) ABSTRACT

The purpose of the present invention is to provide a control unit whereby the quantity of a seal material to be used can be reduced, while ensuring waterproof performance. This electronic control device is provided with: a housing, wherein a plurality of members are bonded, and a peripheral end portion thereof is configured from a plurality of sides; a circuit board housed in the housing; and seal structures that are disposed along the sides at the peripheral end portion. A seal material is provided to the seal structures such that the members are connected to each other. The seal structures disposed on one side of the peripheral end portion are configured such that each of seal cross sectional areas at end (Continued)

portions of the side is smaller than a seal cross sectional area at a center portion of the side.

15 Claims, 24 Drawing Sheets

(52) U.S. Cl.
CPC ........... *H05K 5/0073* (2013.01); *H05K 5/062* (2013.01); *B60W 2710/1005* (2013.01); *F02N 11/08* (2013.01)

(58) Field of Classification Search
CPC .................. H02G 3/081; H02G 3/088; B60W 2710/1005; F02N 11/08
USPC ......... 174/50, 520, 535, 539, 554, 559, 560, 174/50.52; 220/3.2, 4.02; 361/600, 601, 361/641, 679.01; 277/590, 591, 641, 645
See application file for complete search history.

(56) References Cited

U.S. PATENT DOCUMENTS

| | | | |
|---|---|---|---|
| 6,740,809 B2 * | 5/2004 | Vacheron | H05K 5/061 174/50 |
| 7,208,678 B2 * | 4/2007 | Shinmura | H05K 7/20927 174/50 |
| 7,561,435 B2 * | 7/2009 | Kamoshida | H05K 5/062 174/520 |
| 8,053,668 B2 * | 11/2011 | Lai | H05K 9/0009 174/50 |
| 2002/0112870 A1 | 8/2002 | Kobayashi et al. | |
| 2013/0070432 A1 | 3/2013 | Kawai et al. | |
| 2014/0252722 A1 | 9/2014 | Takao et al. | |

FOREIGN PATENT DOCUMENTS

| | | |
|---|---|---|
| JP | 2000-161496 A | 6/2000 |
| JP | 2001-85858 A | 3/2001 |
| JP | 2001-85866 A | 3/2001 |
| JP | 2004-72876 A | 3/2004 |
| JP | 2004-335924 A | 11/2004 |
| JP | 2013-69735 A | 4/2013 |
| JP | 2014-3206 A | 1/2014 |
| WO | WO 2013/051301 A1 | 3/2015 |

OTHER PUBLICATIONS

Japanese-language Written Opinion (PCT/ISA/237) issued in PCT Application No. PCT/JP2015/072159 dated Nov. 24, 2015 (Five (5) pages).

Japanese-language Office Action issued in counterpart Japanese Application No. 2016-545414 dated Dec. 12, 2017 with unverified English translation (six pages).

* cited by examiner

[Fig. 1]
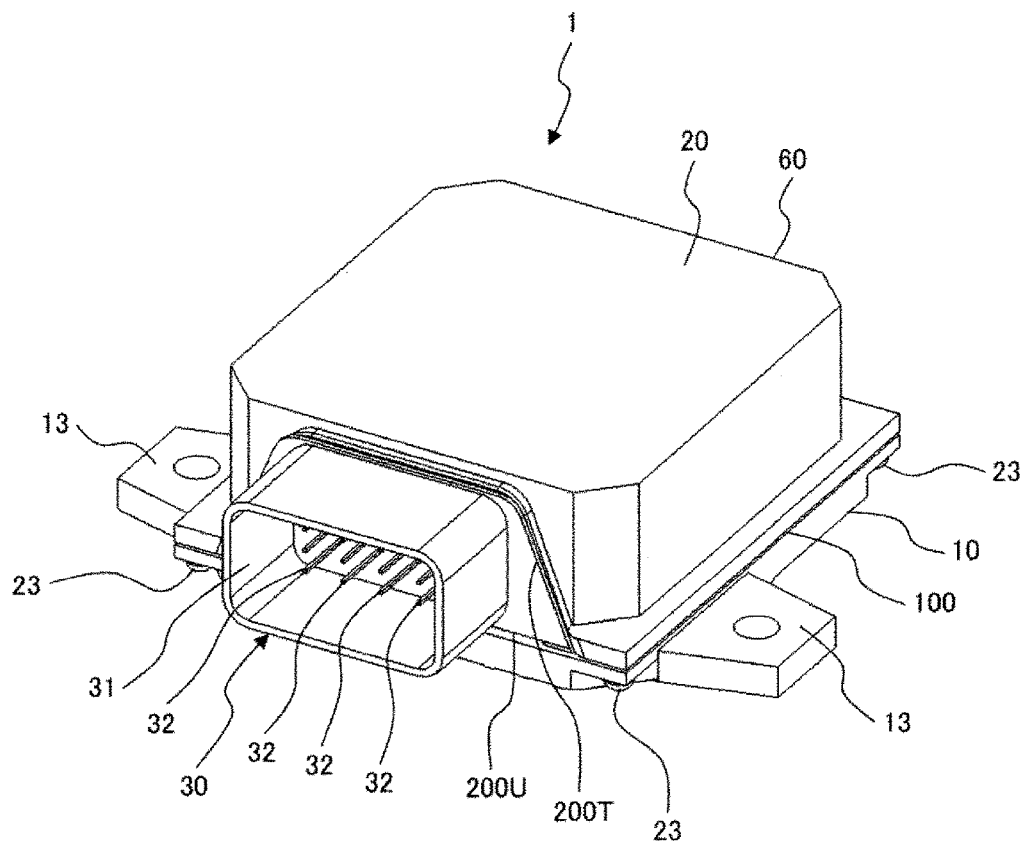

[Fig. 2]
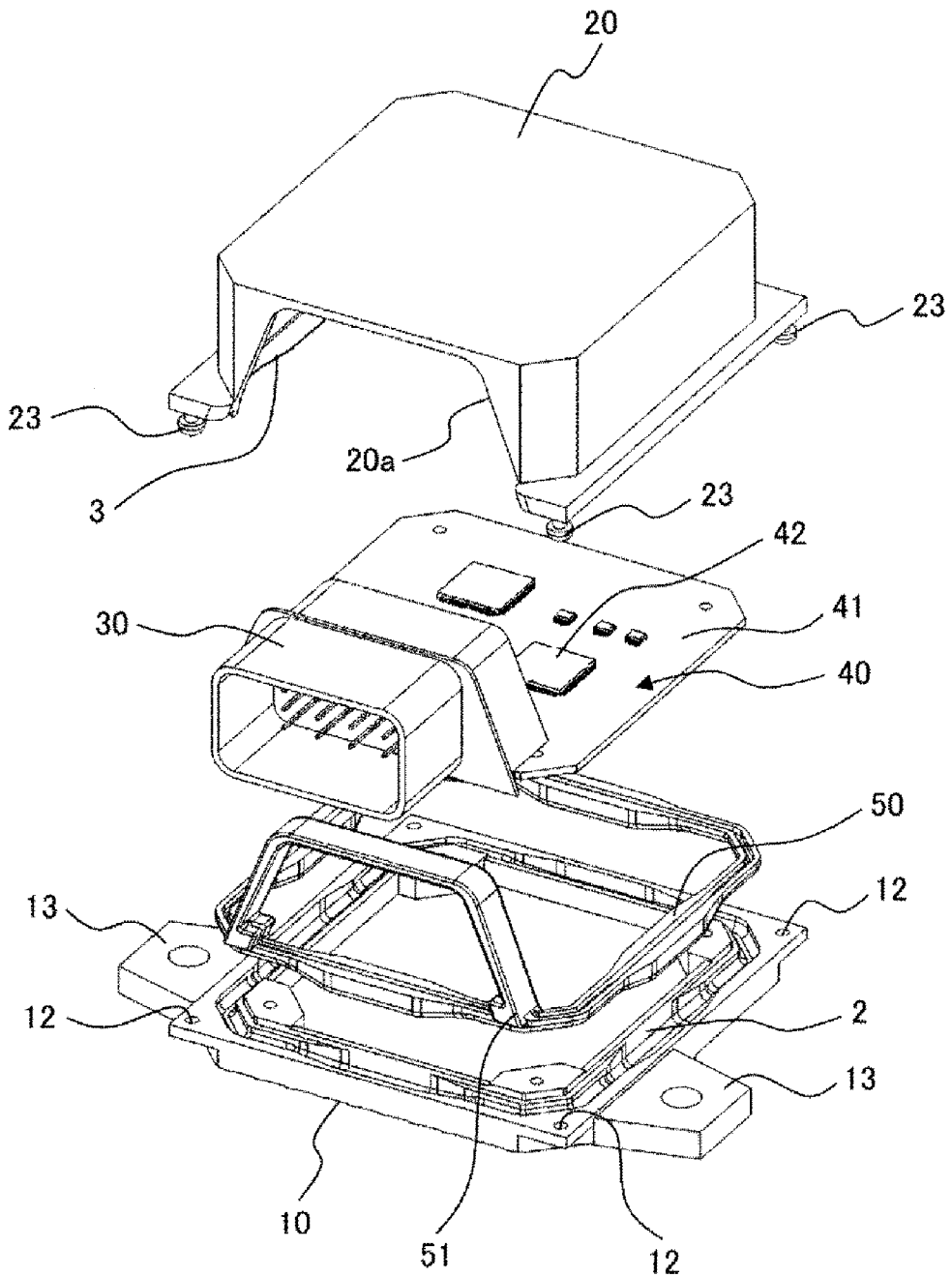

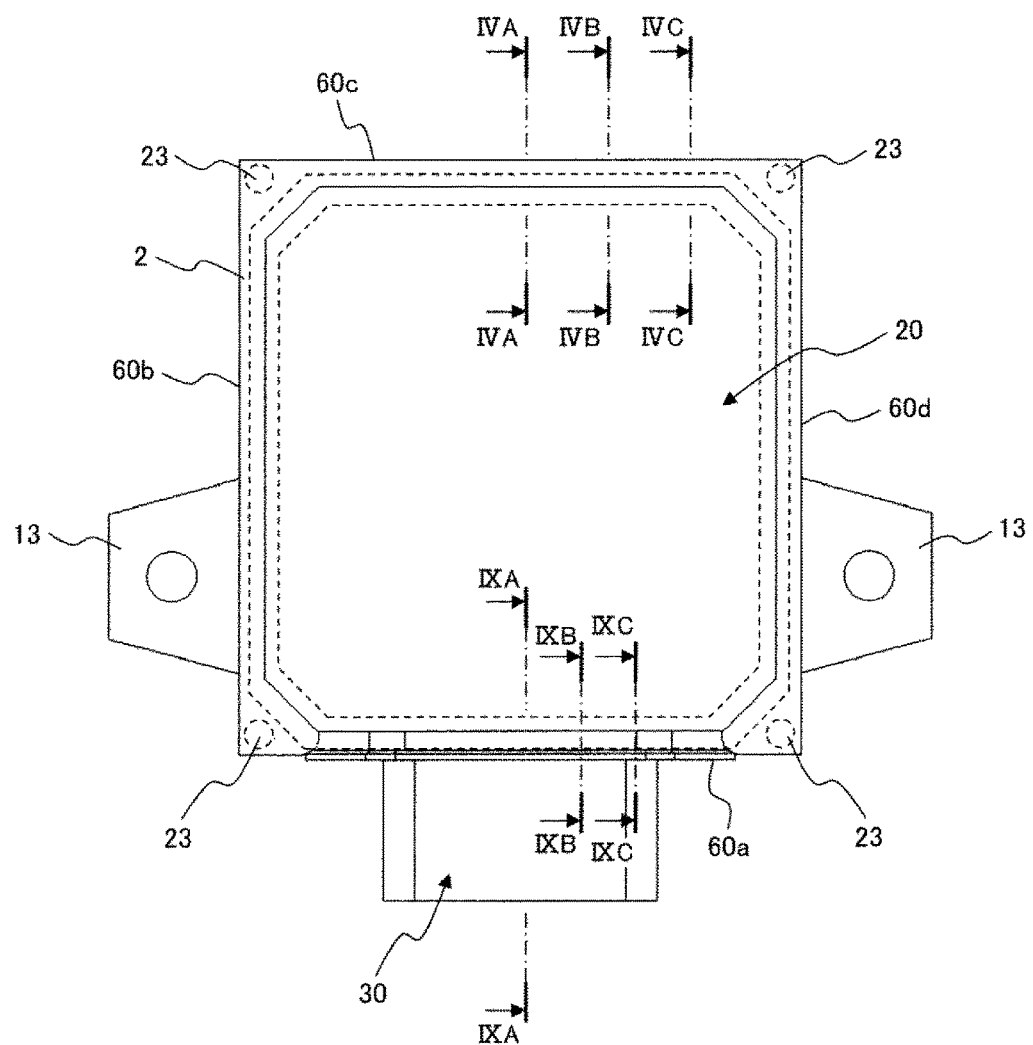
[Fig. 3]

[Fig. 4A]
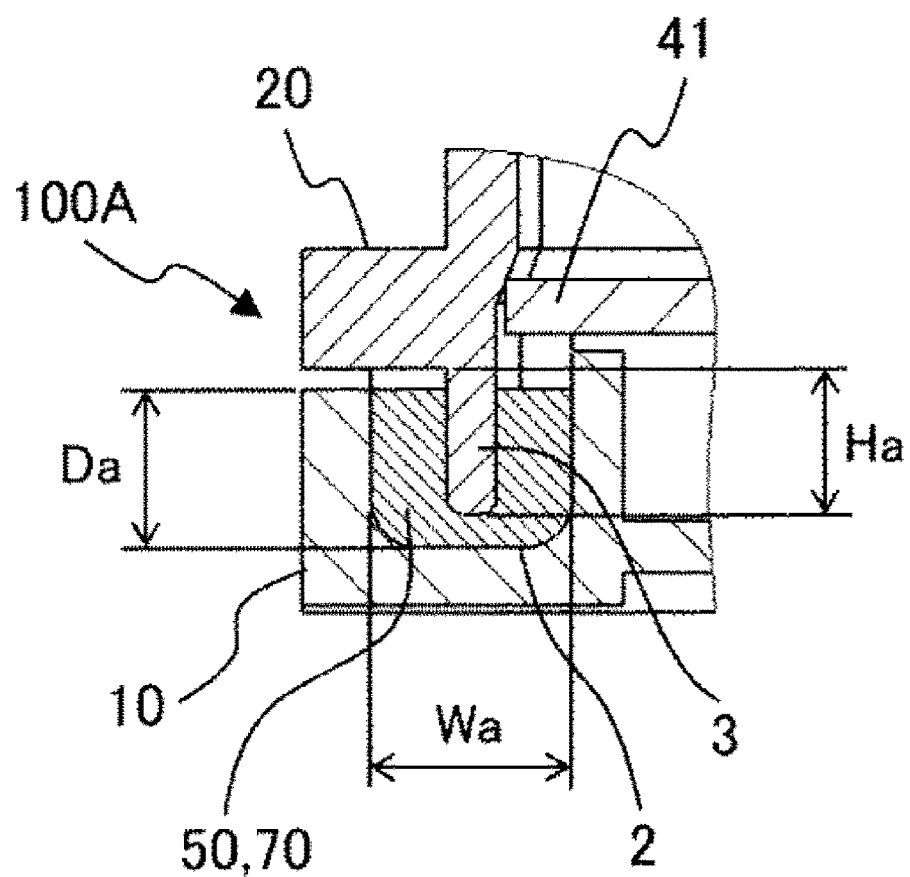

[Fig. 4B]
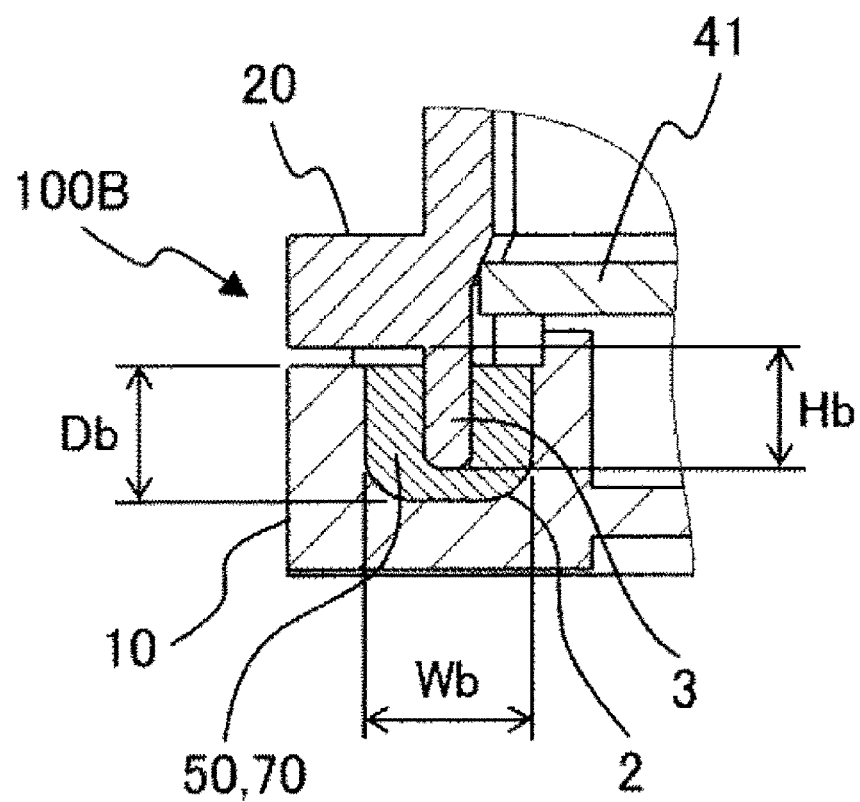

[Fig. 4C]
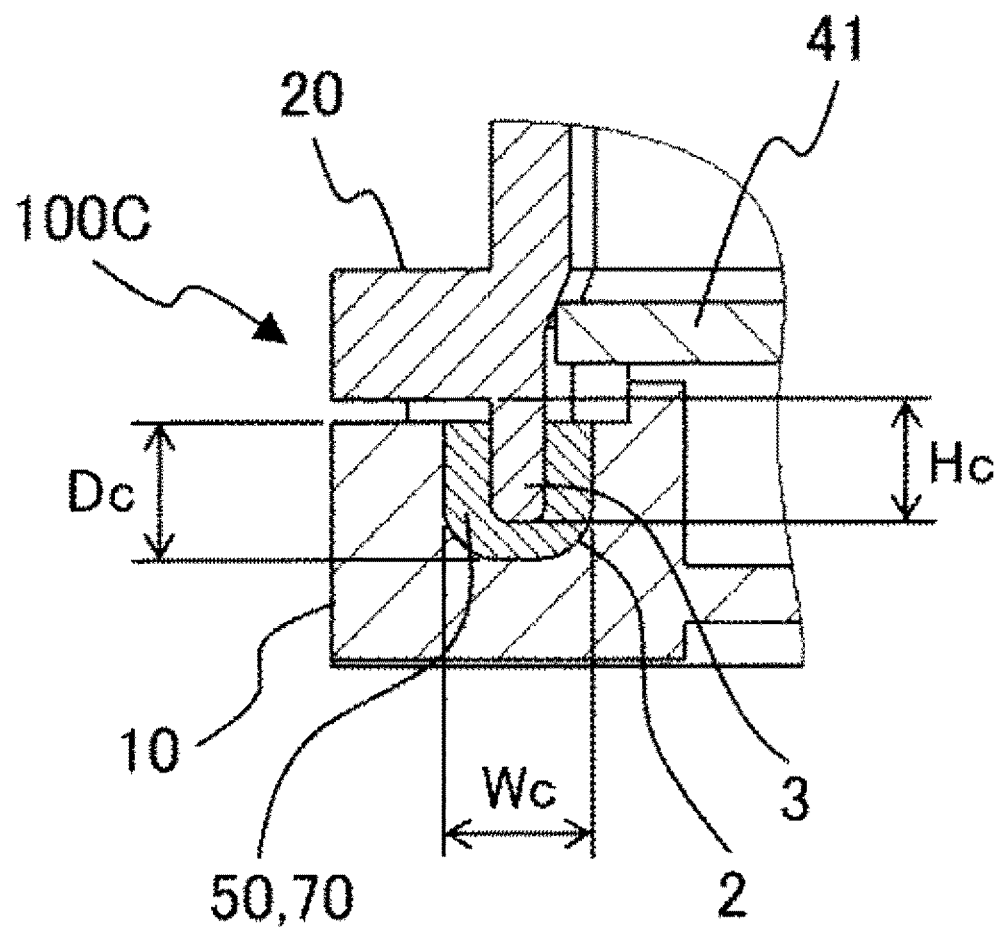

[Fig. 5A]
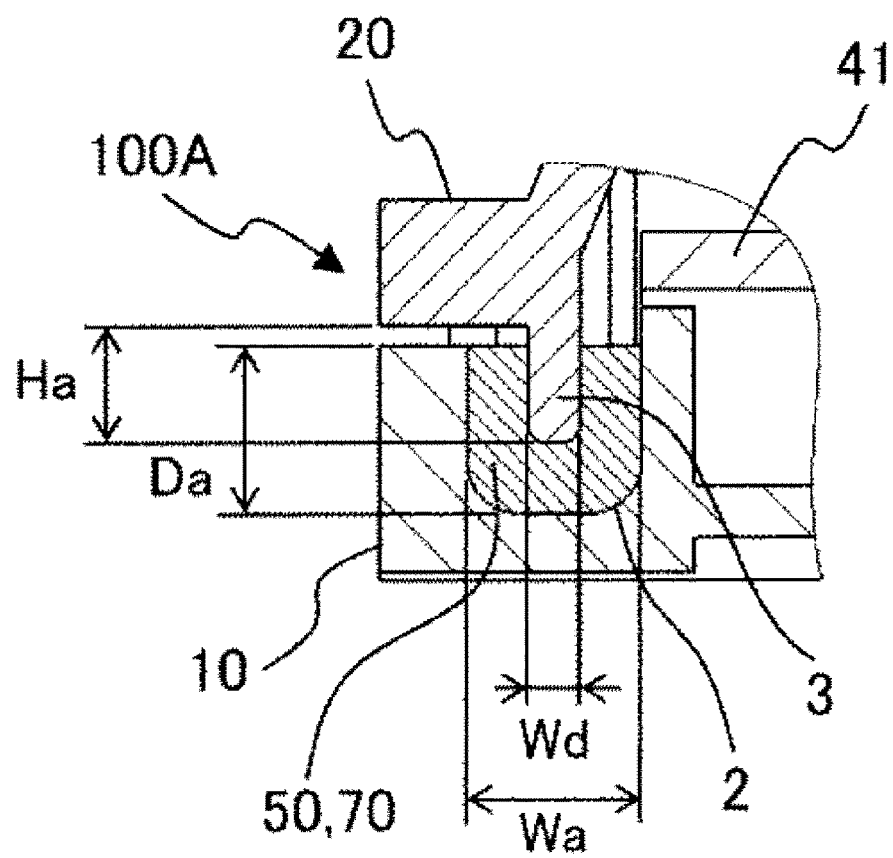

[Fig. 5B]
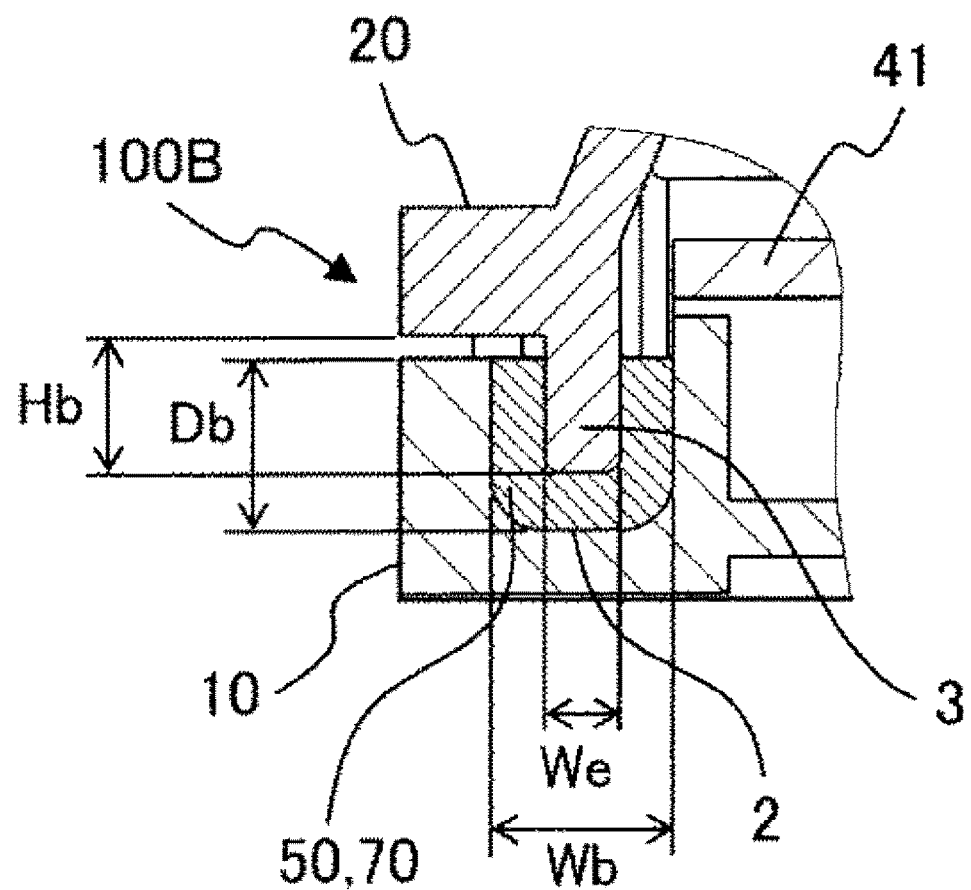

[Fig. 5C]
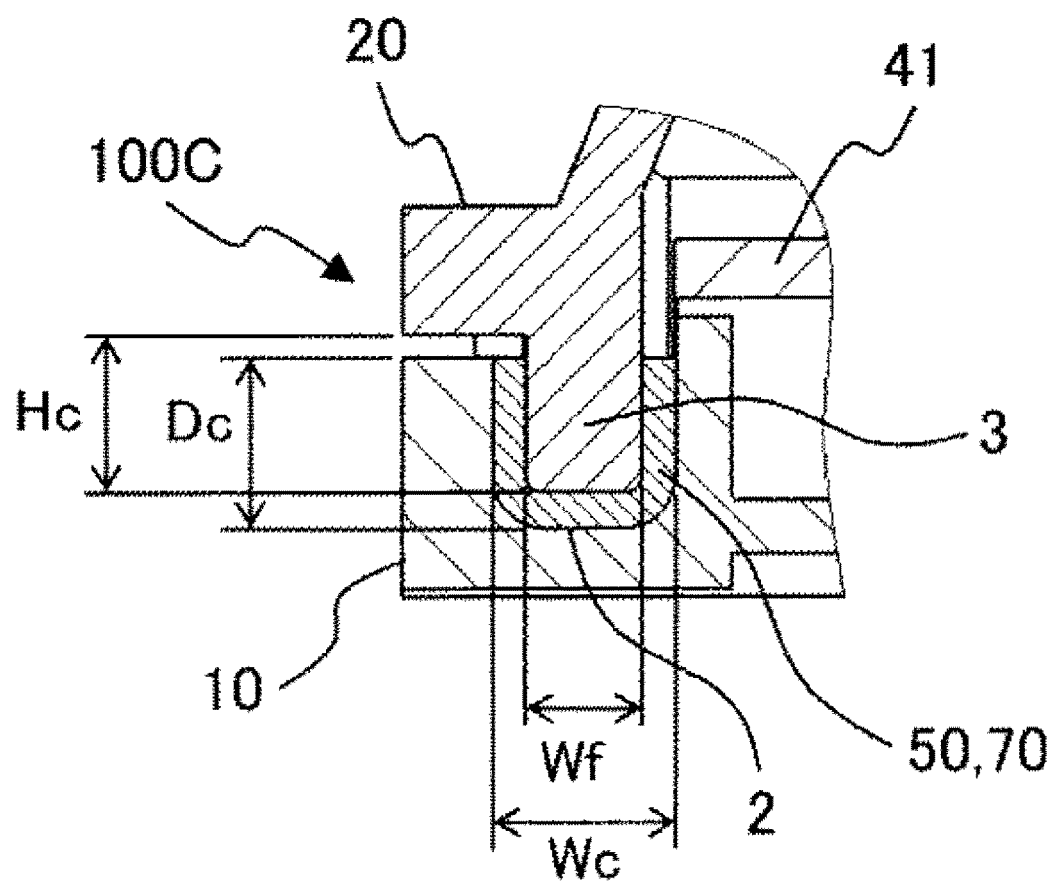

[Fig. 6A]
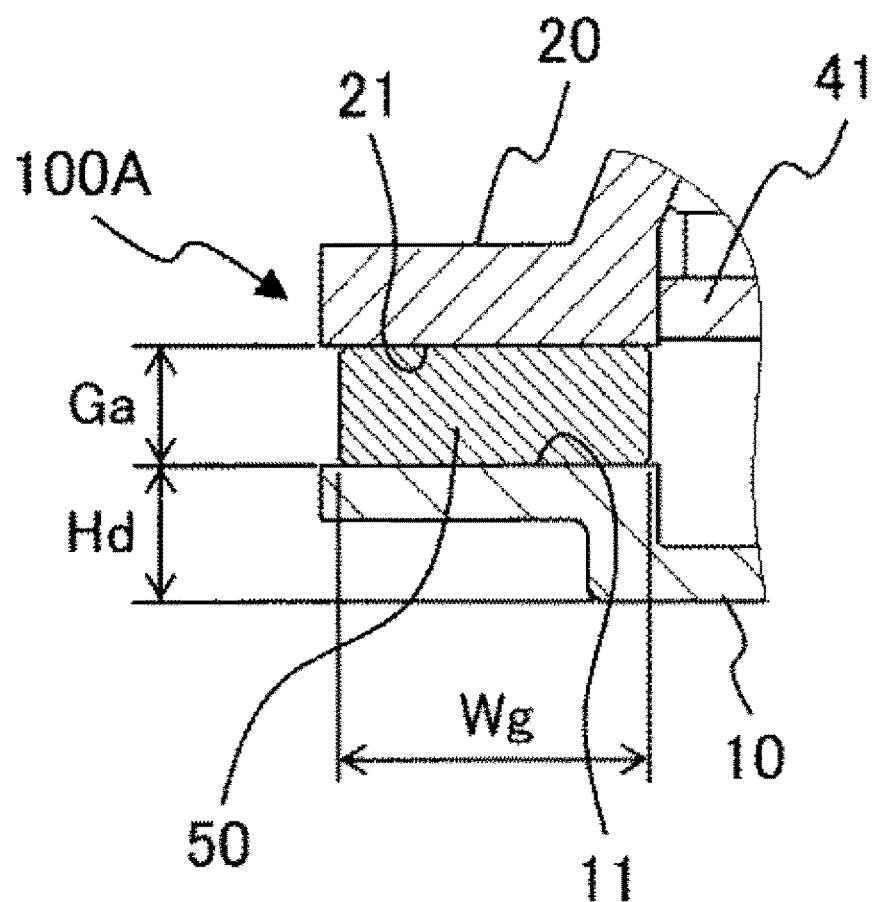

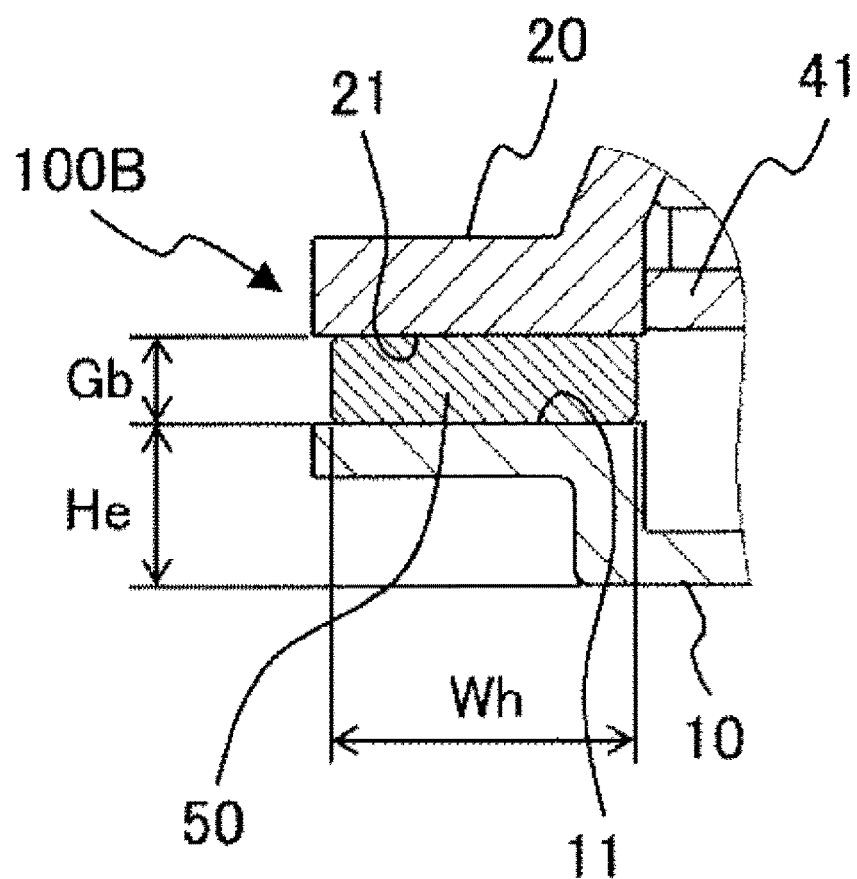
[Fig. 6B]

[Fig. 6C]
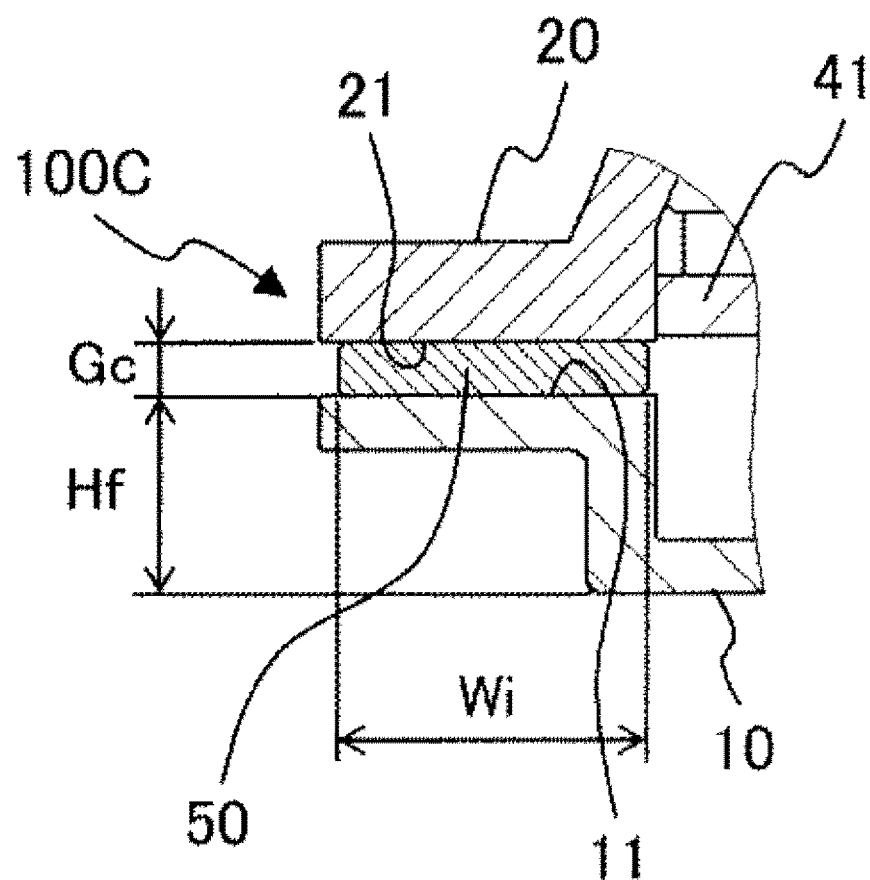

[Fig. 7A]
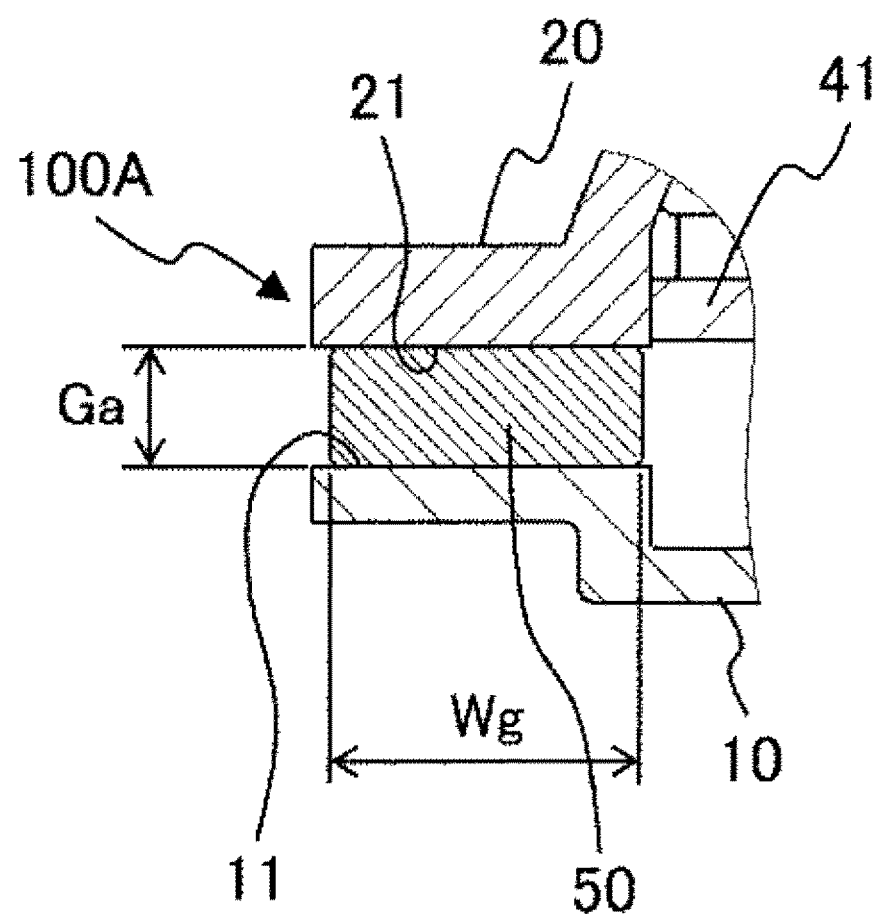

[Fig. 7B]
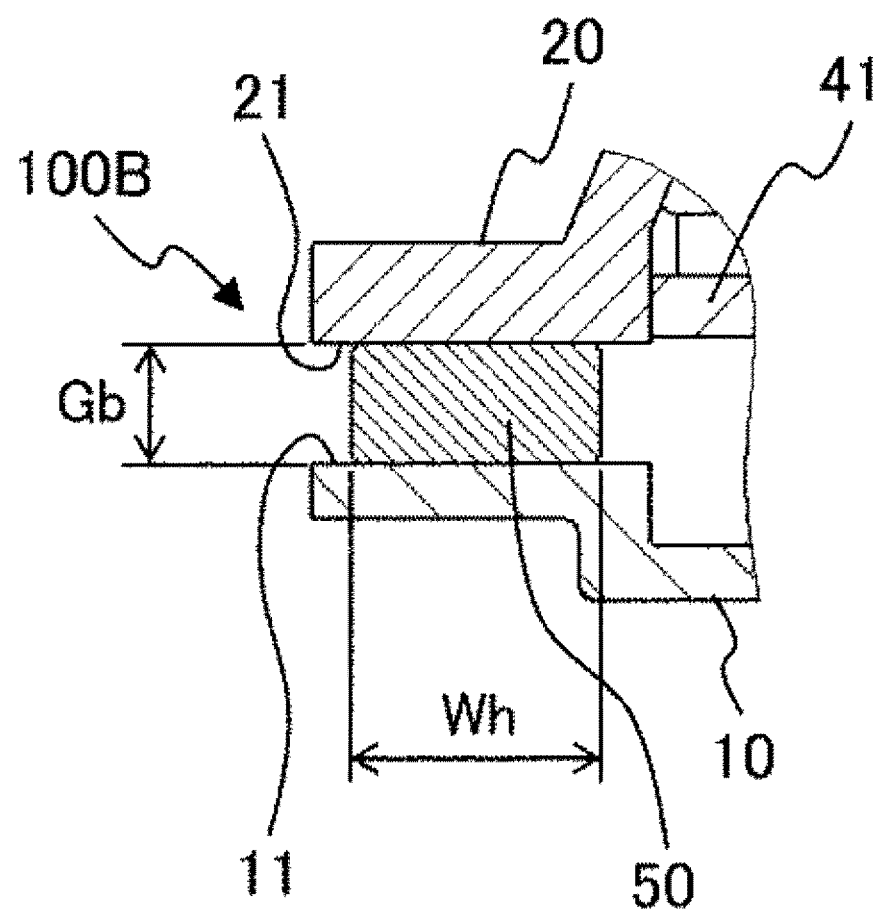

[Fig. 7C]
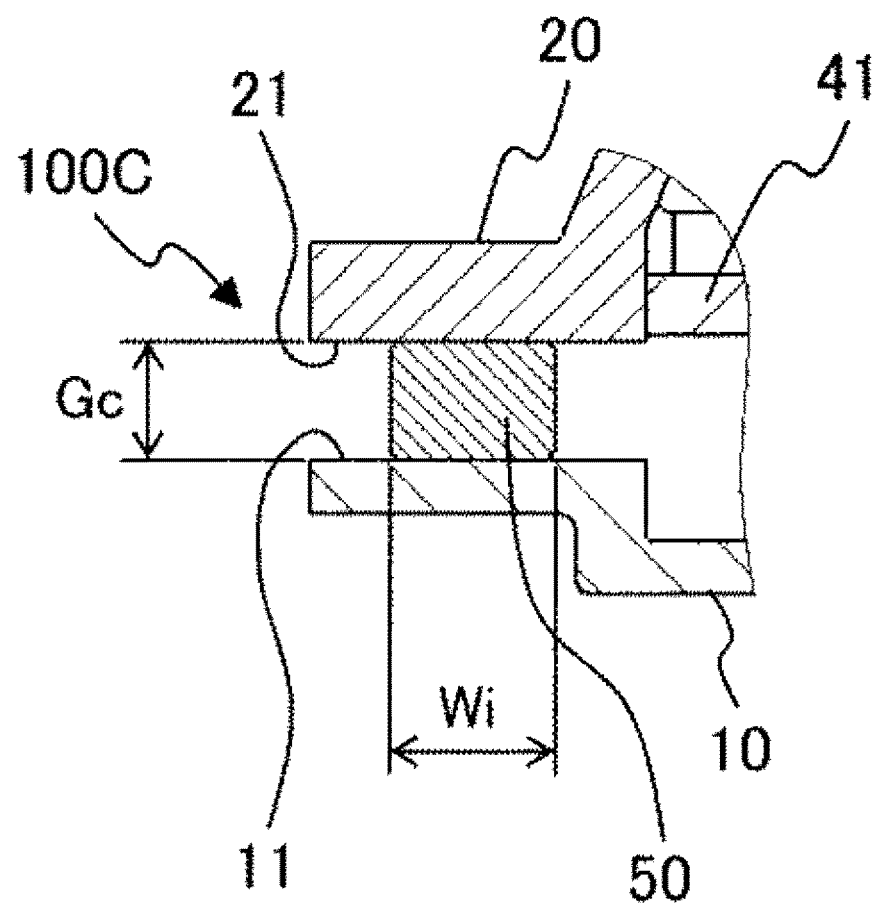

[Fig. 8A]
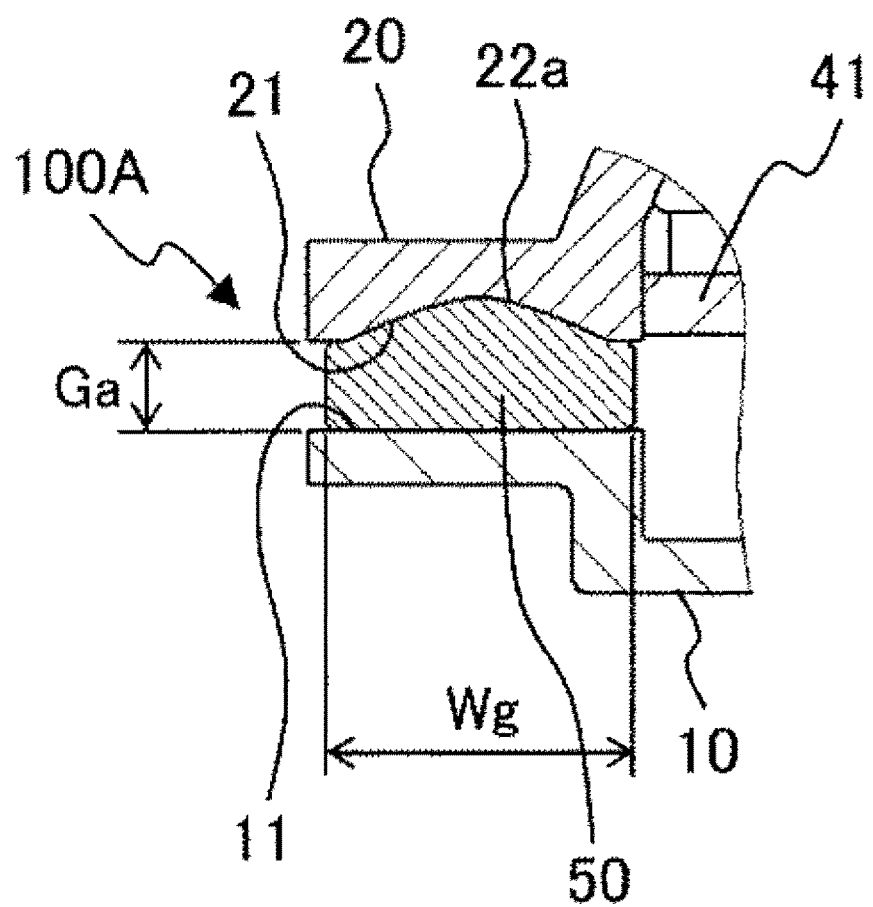

[Fig. 8B]
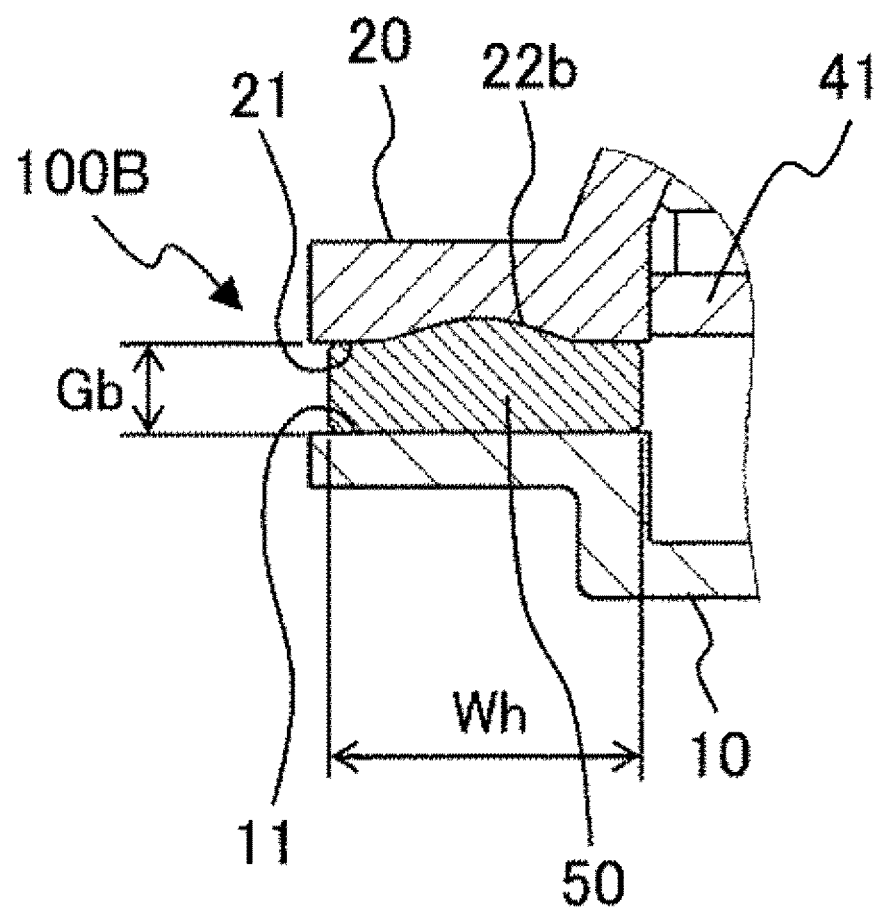

[Fig. 8C]
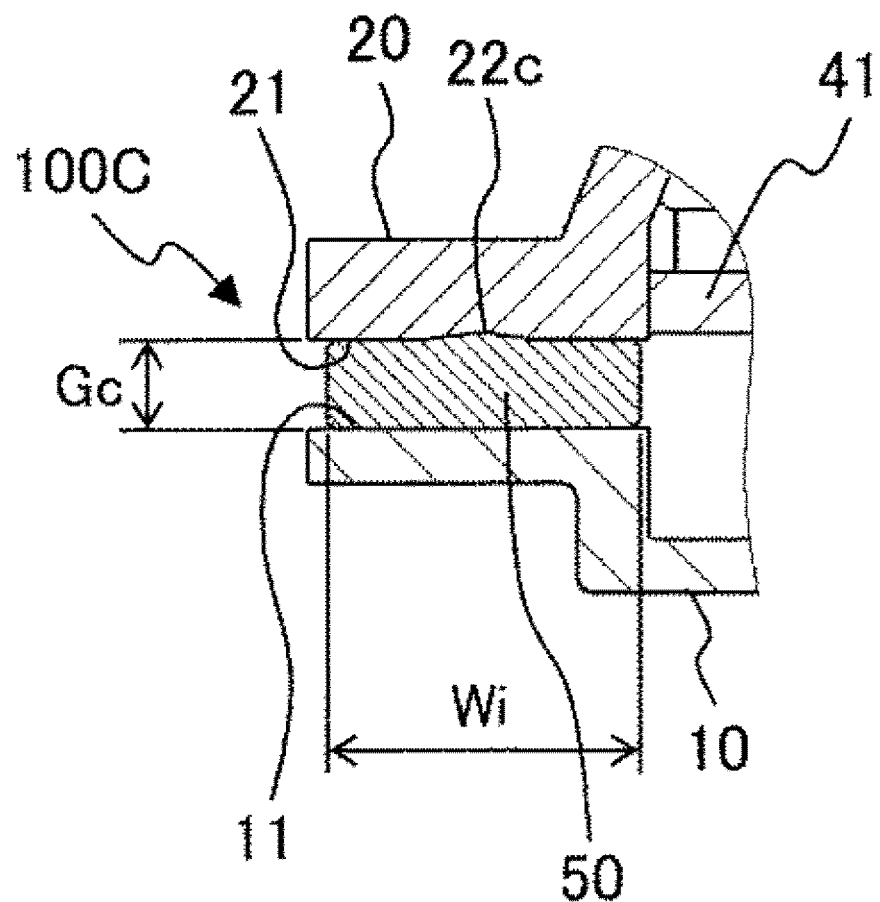

[Fig. 9A]
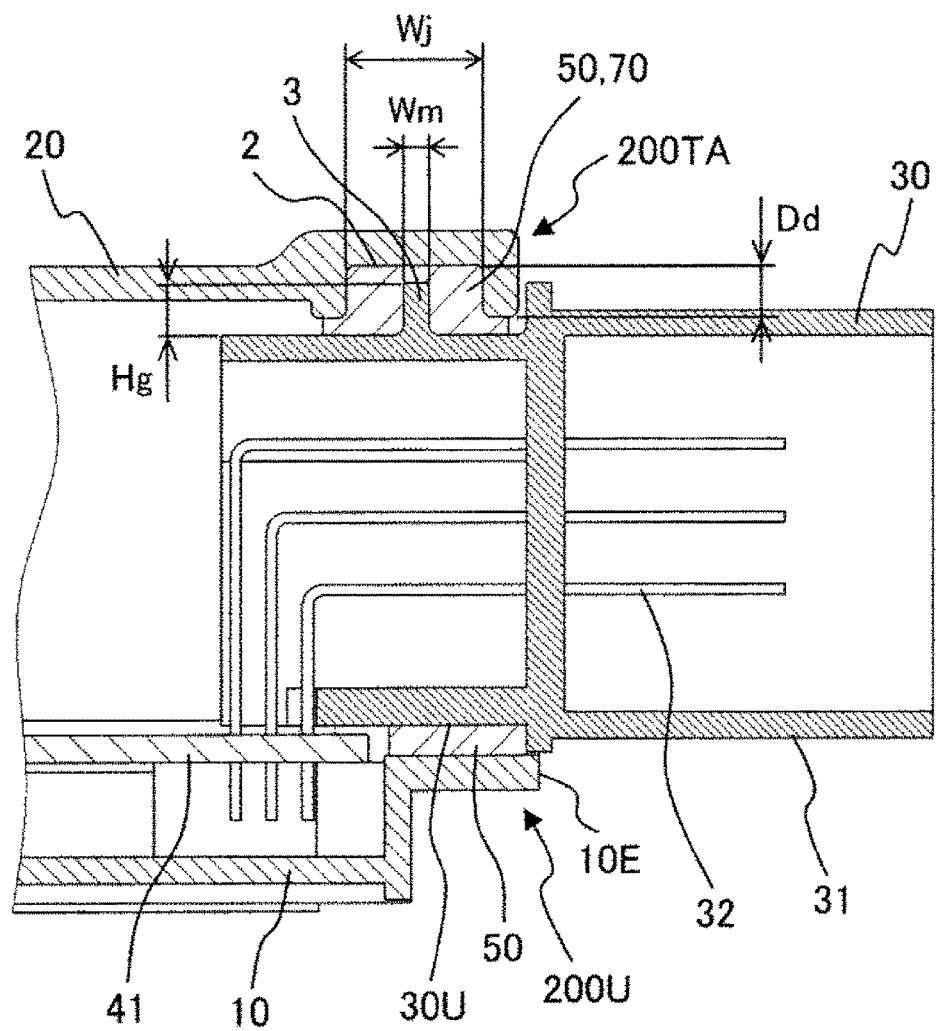

[Fig. 9B]
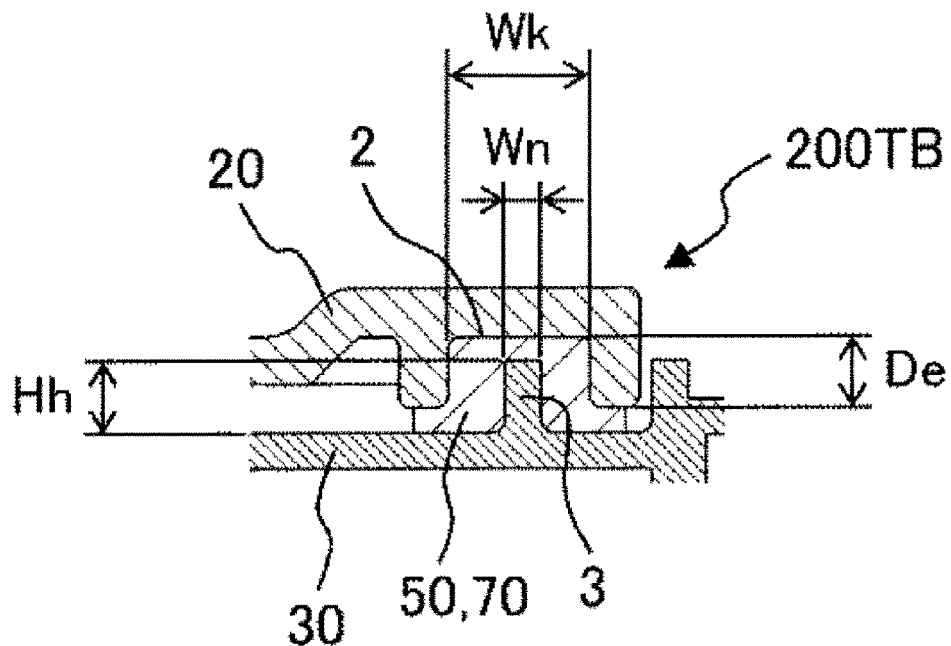
[Fig. 9C]
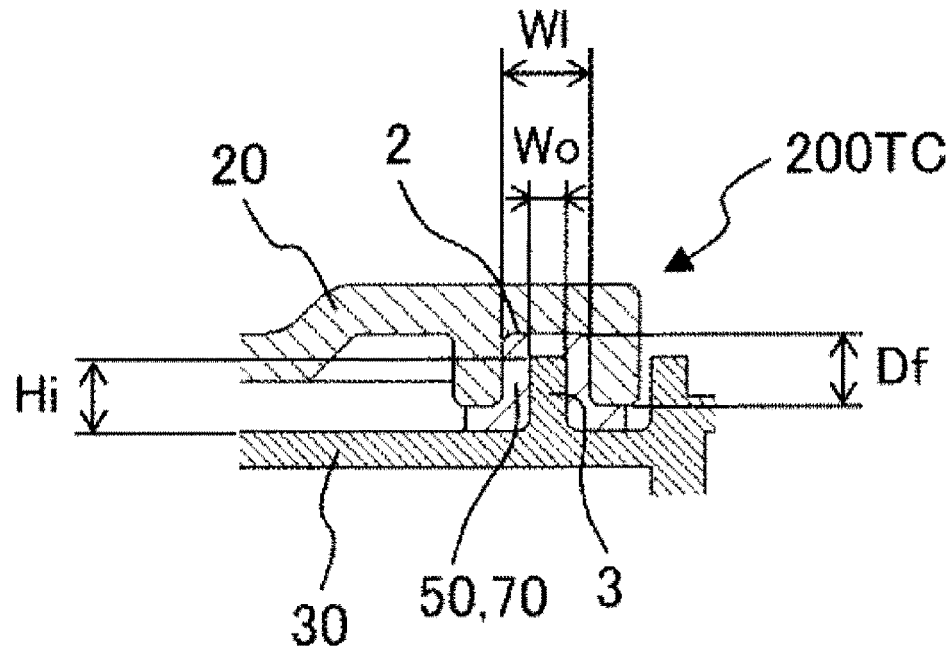

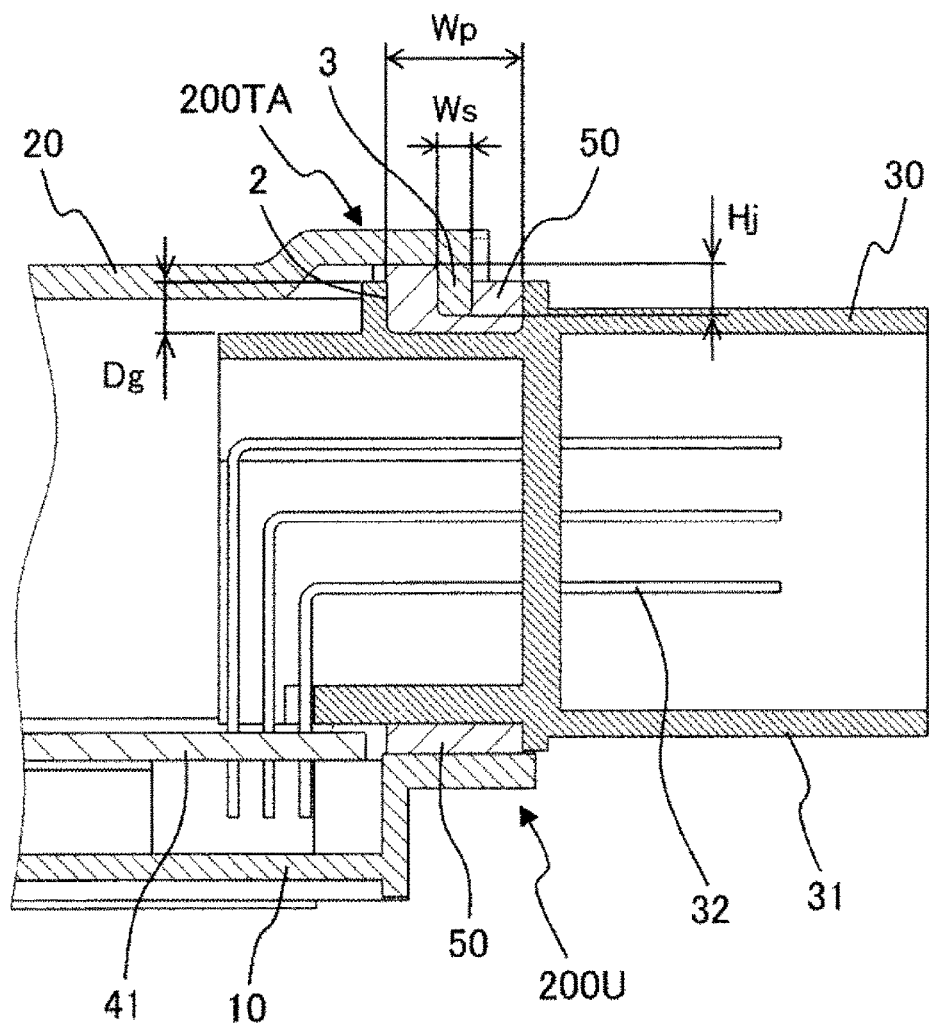
[Fig. 10A]

[Fig. 10B]
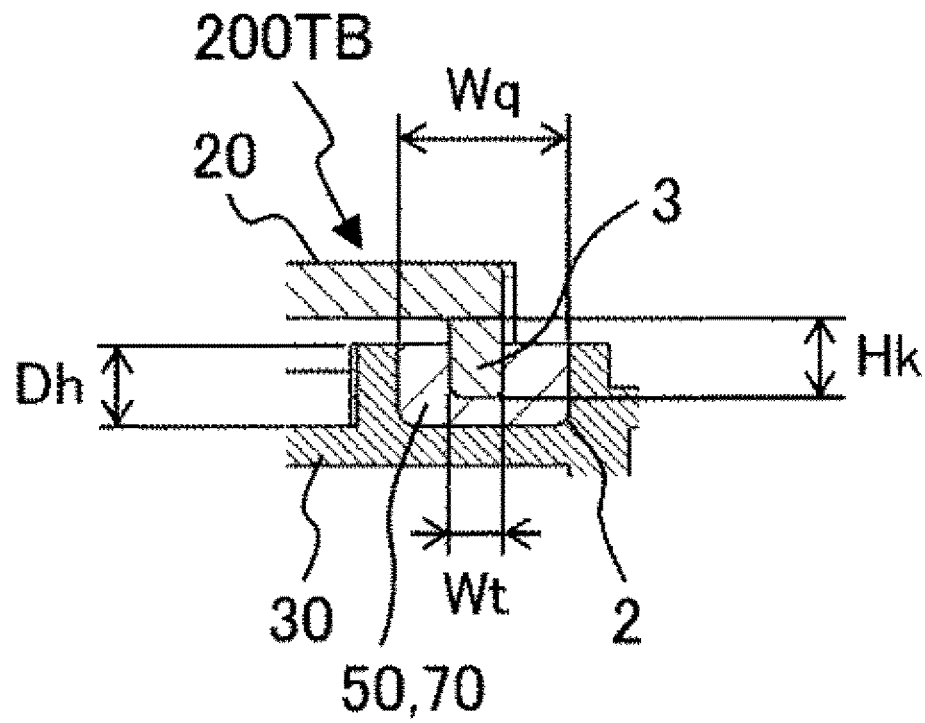
[Fig. 10C]
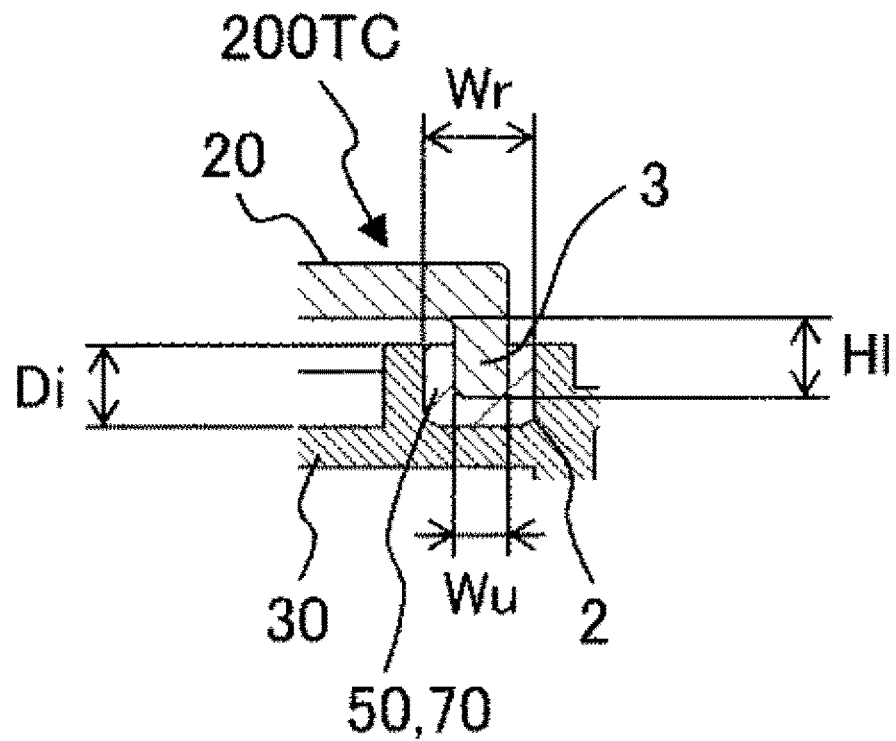

[Fig. 11]
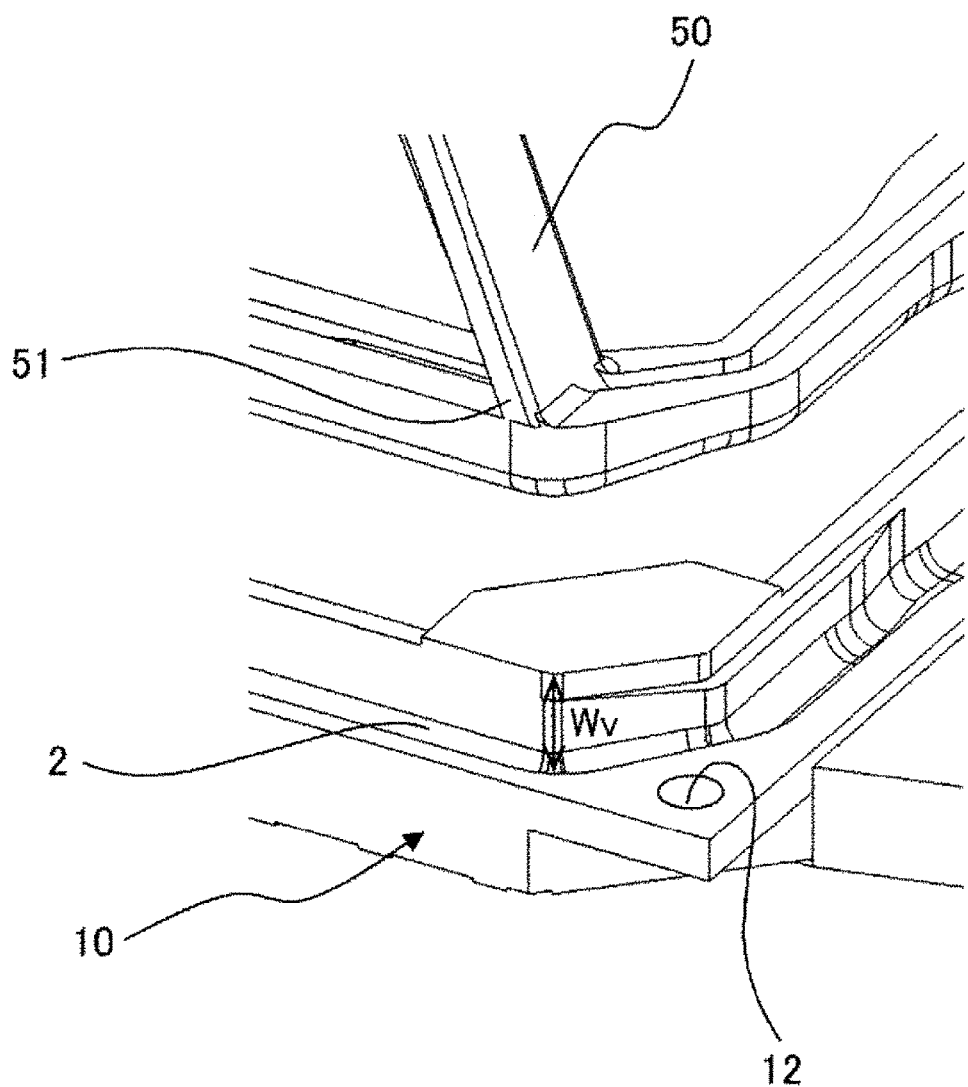

[Fig. 12]
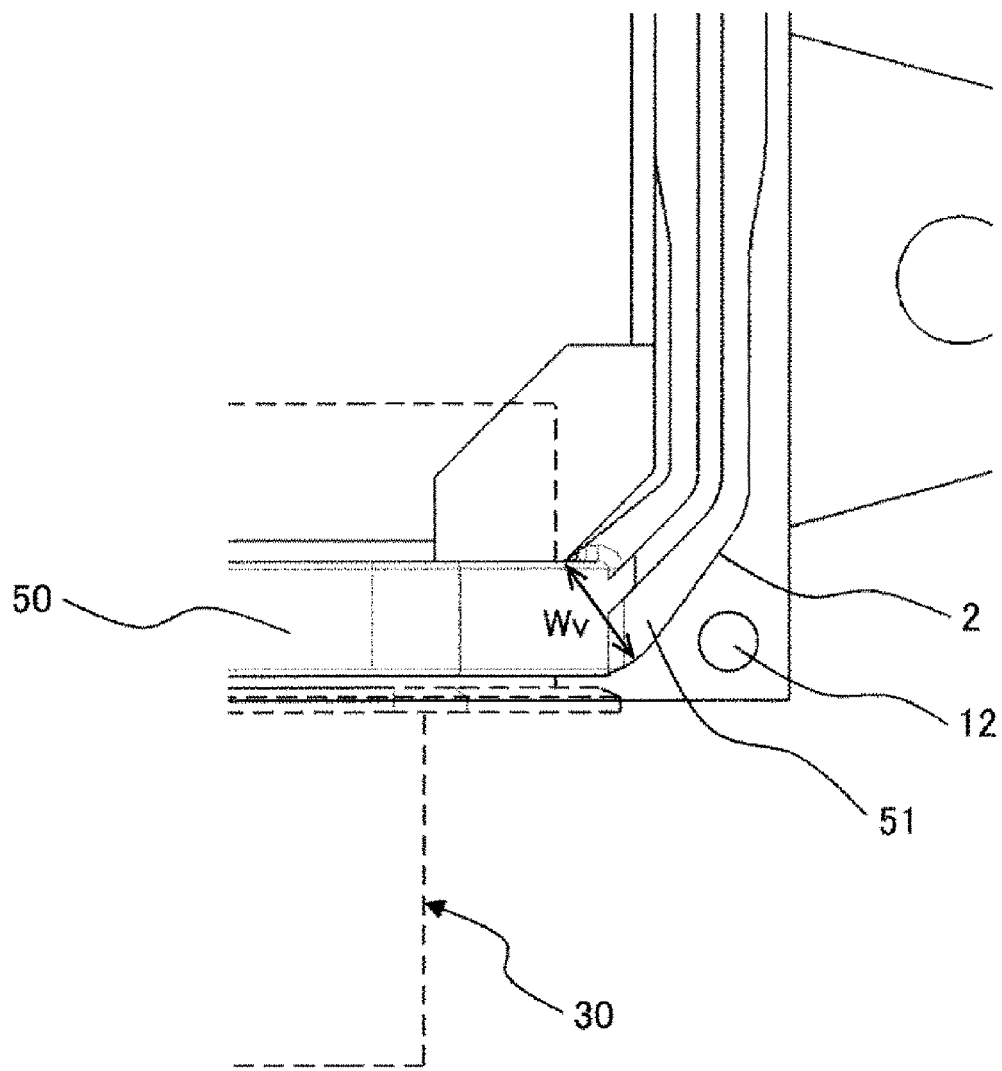

ELECTRONIC CONTROL DEVICE

TECHNICAL FIELD

The present invention relates to a seal structure of an electronic control device which is mounted on an automobile or the like.

BACKGROUND ART

Recently, improvement in fuel efficiency of automobiles, engine room narrowing, and cost reduction of vehicles are advancing in an automobile industry. Electronic control units for controlling engines, transmissions, etc are provided in the vehicle and further reduction in size, weight, and cost are also required in these electronic control units.

Meanwhile, the electronic control units tend to be directly attached to a vehicle body side in an inside of the engine room from an inside of a vehicle passenger compartment, and further to the engines, the transmissions, or the like to be controlled. Therefore, a housing coping with a mounting environment, such as a waterproof structure, a corrosion resistant structure, and coping with high temperature is required in the electronic control units. Accordingly, the electronic control units waterproof an electronic circuit board by interposing a seal material on a peripheral portion or the like of an exterior member forming the housing. A silicone based adhesive and a rubber packing are common as the seal material. However, the silicone based adhesives or the rubber packing is a material with high cost, and wide area for sealing is required. Accordingly, an example of a method for promoting compactness, weight reduction and cost reduction of the electronic control units, includes reduction of the seal material.

As a background art of the present invention, there is a JP-A-2013-69735 (PTL 1). A seal structure of an electronic control device that includes a housing seal portion which is provided in an endless annular shape over the entirety of the periphery of a mating surface portion between a peripheral portion of an upper surface side of a case and a peripheral portion of a lower surface side of a cover, and a connector seal portion which is provided in an endless annular shape over the entirety of the periphery of a joining surface portion between an outer peripheral surface of a connector and an inner peripheral surface of a window portion of the housing (case and cover) is described in paragraphs 0021 to 0027 of PTL 1. The housing seal portion is configured by a seal groove having a U-shaped cross section provided on a case side and a ridge which is provided on lower surface sides of the connector and the cover, is fitted into the seal groove with a predetermined gap, and has a strip shape which has a rectangular-shaped cross section. Then, the gap between the seal groove and the ridge is filled with a seal agent. At this time, the depths and the widths of the seal groove and the ridge are set to be substantially constant over the entirety of the periphery so as to secure a constant seal length. The seal groove and the ridge are also provided in the connector seal portion, as in the housing seal portion. The ridge is provided on the connector side in lower surface side of the connector, and the seal groove is formed on the connector side in a portion excluding the lower surface side thereof. At this time, the seal groove is formed on the lower surface side of the connector so that the depth thereof is deep and the groove width thereof is narrow. In addition, the seal groove is formed on the upper surface side of the connector so that the depth thereof is shallow and the groove width thereof is wide. Accordingly, a seal length of the connector seal portion is set to be constant over the entirety of the periphery thereof. Further, the provision of a fitting structure between an auxiliary seal groove and an auxiliary ridge is described so that the seal length is secured at a joint portion between the connector seal portion and the housing seal portion in paragraphs 0033 to 0038 of PTL 1.

In addition, a vehicle-mounted electronic equipment using a waterproof seal in which an inorganic filler and a water absorbing or hygroscopic organic filler are blended in a resin which reacts with moisture in the atmosphere and is cured by crosslink of polymers with each other is described as a waterproof seal in the abstract of JP-A-2014-3206 (PTL 2).

CITATION LIST

Patent Literature

PTL 1: JP-A-2013-69735
PTL 2: JP-A-2014-3206

SUMMARY OF INVENTION

Technical Problem

In PTL 1, although improvement of the seal performance (waterproof property) is considered by making the seal length constant, consideration for reducing the seal material is not sufficient. In addition, in PTL 2, since it is a technique of replacing the seal material with a new material in order to improve the seal performance (waterproof property) while using an inexpensive material, although adhesive strength can be improved, the amount of the seal material used is not reduced.

An object of the invention is to provide an electronic control device which is capable of reducing the amount of the seal material used while securing waterproof property.

Solution to Problem

In order to achieve the object, an electronic control device of the invention includes a housing which is joined by a plurality of members and of which a peripheral portion is configured by a plurality of sides, a circuit board which is accommodated in an inside of the housing, and a seal structure which is disposed on the peripheral portion along the sides. A seal material is provided in the seal structure so as to connect between the plurality of members. A seal sectional area in an end portion of a side is smaller than that in a central portion of the side in the seal structure which is disposed on the side of the peripheral portion.

Advantageous Effects of Invention

According to the invention, a structure for reducing the seal material without reducing waterproof property is realized, by adopting a structure in which the sectional area of the seal material is changed. Decrease in the cost, the size and weight of the control unit and further improvement of the waterproof reliability can be realized.

BRIEF DESCRIPTION OF DRAWINGS

FIG. 1 is a perspective view illustrating an electronic control unit 1 according to a present Example.

FIG. 2 is an exploded view illustrating the electronic control unit.

FIG. 3 is a top view illustrating the electronic control unit.

FIG. 4A is a partial cross-sectional view taken along line IVA-IVA in FIG. 3.

FIG. 4B is a partial cross-sectional view taken along line IVB-IVB in FIG. 3.

FIG. 4C is a partial cross-sectional view taken along line IVC-IVC in FIG. 3.

FIG. 5A is a partial cross-sectional view (Example 2) taken along line IVA-IVA in FIG. 3.

FIG. 5B is a partial cross-sectional view (Example 2) taken along line IVB-IVB in FIG. 3.

FIG. 5C is a partial cross-sectional view (Example 2) taken along line IVC-IVC in FIG. 3.

FIG. 6A is a partial cross-sectional view (Example 3) taken along line IVA-IVA in FIG. 3.

FIG. 6B is a partial cross-sectional view (Example 3) taken along line IVB-IVB in FIG. 3.

FIG. 6C is a partial cross-sectional view (Example 3) taken along line IVC-IVC in FIG. 3.

FIG. 7A is a partial cross-sectional view (Example 4) taken along line IVA-IVA in FIG. 3.

FIG. 7B is a partial cross-sectional view (Example 4) taken along line IVB-IVB in FIG. 3.

FIG. 7C is a partial cross-sectional view (Example 4) taken along line IVC-IVC in FIG. 3.

FIG. 8A is a partial cross-sectional view (Example 5) taken along line IVA-IVA in FIG. 3.

FIG. 8B is a partial cross-sectional view (Example 5) taken along line IVB-IVB in FIG. 3.

FIG. 8C is a partial cross-sectional view (Example 5) taken along line IVC-IVC in FIG. 3.

FIG. 9A is a partial cross-sectional view (Example 6) taken along line IXA-IXA in FIG. 3.

FIG. 9B is a partial cross-sectional view (Example 6) taken along line IXB-IXB in FIG. 3.

FIG. 9C is a partial cross-sectional view (Example 6) taken along line IXC-IXC in FIG. 3.

FIG. 10A is a partial cross-sectional view (Example 7) taken along line IXA-IXA in FIG. 3.

FIG. 10B is a partial cross-sectional view (Example 7) taken along line IXB-IXB in FIG. 3.

FIG. 10C is a partial cross-sectional view (Example 7) taken along line IXC-IXC in FIG. 3.

FIG. 11 is an enlarged view illustrating a seal material branching portion of Example 8.

FIG. 12 is a top view illustrating the seal material branching portion of Example 8.

DESCRIPTION OF EMBODIMENTS

Hereinafter, examples according to the invention will be described using the drawings. Here, an electronic control unit for an automobile (electronic control unit for vehicle mounting) will be described as an example.

A housing of the electronic control unit is configured by a base (corresponding to case of PTL 1) and a cover, and has a configuration in which a connector is exposed from the housing. A seal material is provided on the joining portion in which the base, the cover, and the connector are joined, respectively. Deformation that each joining portion of the cover, the base and the connector is opened toward the outside is generated due to rise in the ambient temperature of the electronic control unit and rise in the internal pressure thereof. Due to the deformation, high stress is generated in the seal material. In the related art, for example, the width, the thickness, and the sectional area of the seal material are designed so that the maximum stress generated in the seal material is a value enough not to exceed the adhesive force of the seal material. In order to reduce the cost, the size and the weight of the electronic control unit, it is necessary to reduce the seal material. As a method of reducing the seal material, it is considered to uniformly reduce the application amount of the seal material, for example. However, when the application amount of the seal material is uniformly reduced, there is a possibility that the generated stress exceeds the adhesive force of the seal material at the portion where the generated stress becomes a maximum. When the generated stress exceeds the adhesive force of the seal material, since the seal material is peeled off from an application surface of the cover, the base or the connector, waterproof property is unlikely to be kept. Therefore, it is necessary to reduce the seal material while maintaining waterproof property.

In addition, a mounting environment of the electronic control unit for an automobile tends to become more severe. According to this, in the related art, in order to maintain the waterproof property, it is necessary to greatly increase the amount of the seal material used. Therefore, a technique to minimize the increase of the seal material is required.

The electronic control unit 1 according to the examples can cope with a severe environment and can be used to be mounted on various devices used in the severe environment like the environment of automobiles.

EXAMPLE 1

An example of the electronic control unit according to the invention will be described using FIG. 1 to FIG. 4. FIG. 1 is a perspective view illustrating an electronic control unit 1 according to the example. FIG. 2 is an exploded view illustrating the electronic control unit 1. FIG. 3 is a top view illustrating the electronic control unit 1. FIG. 4A, FIG. 4B, and FIG. 4C are partial cross-sectional views taken along line IVA-IVA, line IVB-IVB, and line IVC-IVC in FIG. 3. FIG. 1 to FIG. 3 are commonly used in Example 2 to Example 8.

The electronic control unit 1 includes a plurality of components (members) forming a space in an inside of the housing 60, and is configured by a base 10, a cover 20, and a connector 30, for example. In the following description, a vertical direction is defined based on FIG. 1. In other words, in the housing 60, a base 10 side is defined as a lower side, and a cover 20 side is defined as an upper side. In addition, for convenience, a surface in which there is the cover 20 and a surface of an upper side of the electronic control unit 1 are defined as an upper surface, and a surface of a lower side of the base 10 is defined as a lower surface of the electronic control unit 1. The vertical direction is not related to a mounting direction at the time of mounting the electronic control unit 1.

A seal material 50 for waterproofing is interposed between the base 10, the cover 20 and the connector 30, respectively and the base 10, the cover 20 and the connector 30 are joined to each other. In a case of being viewed from the upper surface side or the lower surface side, as illustrated in FIG. 3, the housing 60 has a substantially quadrangular shape, and has a side 60a, a side 60b, a side 60c, and a side 60d. An outer shape of the base 10 has a substantially quadrangular shape and has four sides along the side 60a to the side 60d. An outer shape of the cover 20 has a substantially quadrangular shape and has four sides along the side 60a to the side 60d. However, as illustrated in FIG. 2, the cover 20 has an opening 20a formed on a side along the side 60a of the housing 60. The opening 20a is formed by a recess recessed from the lower side toward the upper side.

The joining structure between the base 10 and the cover 20 will be described. A seal structure 100 and seal structures 200T and 200U are formed on the peripheral portion of the housing 60.

A seal groove structure 2 constituting the seal structure 100 is formed on a peripheral portion of the base 10. The seal groove structure 2 is formed at least on a side along the side 60b to the side 60d. The side along the side 60a is a portion to be joined with the connector 30, and the seal structures 200T and 200U are configured therein. The seal structures 200T and 200U will be described below. There is also a case where the seal groove structure 2 is simply referred to as a seal groove 2. On the other hand, a ridge 3 to be fitted into the seal groove structure 2 with a gap 70 is provided on the peripheral portion of the cover 20. The ridge 3 is formed at least on a side along the side 60b to the side 60d.

As illustrated in FIG. 4A, FIG. 4B, and FIG. 4C, the ridge 3 is fitted with a gap 70 between a groove side surface and a groove bottom surface of the seal groove structure 2. The gap 70 is filled with the seal material 50, and the base 10 and the cover 20 are joined together. The seal material 50 is a liquid silicone resin, for example, and after the seal material is applied to the seal groove structure 2, the ridge 3 of the cover 20 is fitted therein and the seal material 50 is cured to realize waterproof property.

The side along the side 60a is a portion to be joined with the connector 30, and it will be described below.

Reference numeral 40 denotes a circuit board constituting the electronic control unit 1, which is housed in a space formed by the base 10, the cover 20, the connector 30, and the seal material 50. The circuit board 40 is made of an insulating board 41 formed as a substantially quadrangular shape plate body by an insulating resin material or the like, for example, and a wiring pattern is provided on an upper surface and a lower surface thereof. A plurality of electronic components 41 made of a capacitor, a coil, a transistor, a semiconductor IC or the like, for example is mounted on the circuit board 40.

The connector 30 is configured by a connector housing 31 and a connector pin 32. The connector 30 is connected to various sensors, actuators, or the like provided on the vehicle side and thus the electronic control unit 1 controls the engine.

Reference numeral 13 is two bracket portions provided on the outer surface side of the base 10, for example, and constitutes an attaching portion which attaches the electronic control unit 1 to a vehicle body of an automobile or the like.

The cover 20 is fixed to the base 10 and formed by injection molding of resin, for example. The cover 20 is fixed to the base 10 by a cover fixing hole 12 provided in the base 10 and a thermal caulking portion 23 for example. In other words, the fixing hole 12 and the thermal caulking portion 23 constitute a fixing portion which fixes the cover 20 and the base 10. The fixing method of the cover 20 is not limited to thermal caulking. For example, fixing methods such as caulking, snap fitting, screws, tapping screws, rivets, adhesive bonding, press-fitting, or the like may be used.

The seal structure of the base 10 and the cover 20 will be described in detail.

In this example, as illustrated in FIG. 4A, FIG. 4B, and FIG. 4C, the seal structure 100 of the base 10 and the cover 20 is configured by the seal groove structure 2, the ridges 3 and the seal material 50. In this seal structure 100, at least one of the width of the groove and the depth of the groove is changed according to the distance from the fixing portion. The seal material 50 of the entirety of the electronic control unit 1 is reduced by making the width of the groove narrow and making the depth of the groove shallow in the vicinity of the fixing portions 12 and 23. In this case, it is also possible to decrease the height of the ridge 3 in the vicinity of the fixing portions according to the depth of the seal groove structure 2.

In other words, in this example, in a case where the cross sectional area of the gap which is formed on the inside of the groove of the seal groove structure 2 and is filled with the seal material 50 is compared at two points of which distances from the fixing portions 12 and 23 are different from each other, a side of the cross sectional area at a position which is close to the fixing portions 12 and 23 is made smaller than the cross sectional area at a position which is away from the fixing portions 12 and 23. Hereinafter, this sectional area is referred to as a seal sectional area. A groove width, a groove depth, a ridge height and a ridge width (thickness) can be changed so as to satisfy this relationship. The sectional area is an area of a section (cross section) in a direction perpendicular to an extending direction (longitudinal direction) of the groove.

FIG. 4A illustrates a seal structure 100A at a position which is farthest from the fixing portions 12 and 23 in the side 60c of the housing 60. FIG. 4B illustrates a seal structure 100B at a position which is away from the fixing portions 12 and 23 next to FIG. 4A. FIG. 4C illustrates a seal structure 100C at a position which is closest to the fixing portions 12 and 23.

In the seal structure 100C at a position which is closest to the fixing portions 12 and 23, a groove width Wc is the narrowest among the three seal structures 100A, 100B, and 100C. In the seal structure 100A at a position which is farthest from the fixing portions 12 and 23, a groove width Wa is the widest among the three seal structures 100A, 100B and 100C. In the seal structure 100B in which the distance from the fixing portions 12 and 23 is intermediate between the seal structure 100A and the seal structure 100C, a groove width Wb is an intermediate width between the groove width Wa of the seal structure 100A and the groove width Wc of the seal structure 100C.

In the seal structure 100C at a position which is closest to the fixing portions 12 and 23, a groove depth Dc is the shallowest among the three seal structures 100A, 100B, and 100C. In the seal structure 100A at a position which is farthest from the fixing portions 12 and 23, a groove depth Da is the deepest among the three seal structures 100A, 100B, and 100C. In the seal structure 100B in which the distance from the fixing portions 12 and 23 is intermediate between the seal structure 100A and the seal structure 100C, a groove depth Db is an intermediate depth between the groove depth Da of the seal structure 100A and the groove depth Dc of the seal structure 100C.

In other words, the groove width and the groove depth are in a relationship of Wa>Wb>Wc and Da>Db>Dc. The height of the ridge 3 has a relationship that a ridge height Ha of the seal structure 100A, a ridge height Hb of the seal structure 100B and a ridge height Hc of the seal structure 100C are Ha>Hb>Hc. The ridge heights Ha, Hb, and Hc maybe the same height as long as the relationship of the seal sectional area described above is satisfied. However, a gap has to be formed between a tip of the ridge 3 and a bottom of the groove 2.

An adhesive length (seal length) between an inner wall of the seal groove structure 2 and the seal material 50 is reduced in both a case where the depth of the seal groove structure 2 is shallow and a case where the width of the seal groove structure 2 is narrowed. The length of the seal length contributes to the corrosion resistance of the electronic control unit 1. In a case where the seal groove structure 2 is narrowed, the seal material 50 can be reduced without the corrosion resistance being significantly decreased since the reduction in the seal length is decreased with respect to the reduction amount of the seal material 50, as compared with a case where the seal groove structure 2 is made shallow.

In addition, in a case where this example is applied to a case where the mounting environment of the electronic control unit 1 becomes severer than the mounting environment in the related art, the groove width of the seal groove structure 2 in the vicinity of the fixing portions is made the same as that in the related art and the width of the seal groove structure 2 at a portion which is far from the fixing portions is increased, for example. There is a high concern that the seal material 50 is peeled off in a portion which is far from the fixing portions of the base 10 and the cover 20. Therefore, the increase amount of the seal material 50 can be suppressed to a minimum by increasing the seal material 50 only around the portion where there is a high concern that the seal material 50 is peeled off.

In the above description, the seal sectional area is changed based on the distance from the fixing portions. In the vicinity of the fixing portions 12 and 23, the fixing portions 12 and 23 suppress the deformation of each of the joining portions of the cover, the base and the connector, and suppress the stress generated in the seal material 50. In this sense, in this example, the seal sectional area is determined based on the stress generated in the seal material 50. In other words, in the seal structure formed along the sides 60b, 60c, or 60d of the housing 60, the seal sectional area at the position where stress generated in the seal material 50 is large is made larger than the seal sectional area at the position where stress generated in the seal material 50 is small.

Normally, the fixing portions 12 and 23 are provided at the four corners of the housing 60. In the four corners, the seal groove structure 2 and the ridge 3 constitute a bent portion, which is also a portion where rigidity is high with respect to the force to open outward. Therefore, in the seal structure configured along the sides 60b, 60c, and 60d of the housing 60, deformation is unlikely to be generated as it approaches both end portions of the side. Therefore, the stress generated in the seal material 50 also tends to become smaller as it approaches both end portions of the side. Therefore, in the seal structure configured along one side, it is preferable that the seal sectional area of the portion positioned on the center side is larger than the seal sectional area of the portion positioned on the end portion side. This means that the seal sectional area is made large at the position where the stress generated in the seal material 50 is large among the sides 60b, 60c, and 60d of the housing 60.

EXAMPLE 2

A second example according to the invention will be described using FIG. 5A, FIG. 5B, and FIG. 5C. FIG. 5A, FIG. 5B, and FIG. 5C are partial cross-sectional views illustrating cross sections taken along line IVA-IVA, line IVB-IVB, and line IVC-IVC in FIG. 3, as in FIG. 4A, FIG. 4B and FIG. 4C.

In this example, in order to make the seal sectional area at a position which is close to the fixing portions 12 and 23 smaller than the seal sectional area at a position which is away from the fixing portions 12 and 23, the width of the ridge 3 in the vicinity of the fixing portion 12 and 23 of the cover 20 is increased, or the height of the ridge 3 therein is increased. Accordingly, the amount of the seal material 50 in the vicinity of the fixing portions can be reduced.

Specifically, in the seal structure 100C at a position which is closest to the fixing portions 12 and 23, the ridge width Wf is the largest among the three seal structures 100A, 100B, and 100C. In the seal structure 100A at a position which is farthest from the fixing portions 12 and 23, the ridge width Wd is the smallest among the three seal structures 100A, 100B, and 100C. In the seal structure 100B in which the distance from the fixing portions 12 and 23 is intermediate between the seal structure 100A and the seal structure 100C, the ridge width We is an intermediate size between the ridge width Wd of the seal structure 100A and the ridge width Wf of the seal structure 100C.

In addition, in the seal structure 100C at a position which is closest to the fixing portions 12 and 23, the ridge height Hc is the highest among the three seal structures 100A, 100B, and 100C. In the seal structure 100A at a position which is farthest from the fixing portions 12 and 23, the ridge height Ha is the lowest among the three seal structures 100A, 100B, and 100C. In the seal structure 100B in which the distance from the fixing portions 12 and 23 is intermediate between the seal structure 100A and the seal structure 100C, the ridge height Hb is an intermediate height between the ridge height Ha of the seal structure 100A and the ridge height Hc of the seal structure 100C.

In other words, the ridge width has a relationship of Wd<We<Wf. In addition, the ridge height has a relationship of Ha<Hb<Hc. The groove depths Da, Db and Dc are the same depth. The groove depths Da, Db, and Dc may be changed within a range where the seal sectional area satisfies the relationships described above. In addition, a gap has to be formed between the tip of the ridge 3 and the bottom of the groove 2.

The material of the cover 20 is a resin such as PBT, for example and PBT is generally a cheap material with respect to the material used for the seal material 50. In this example, although the material of the cover 20 increases according to the reduction amount of the seal material 50, the cost of the electronic control unit 1 as a whole can be reduced.

Furthermore, in the case of this example, the height and width of the ridge 3 can be changed by a slope being provided. For example, in the case of using the liquid seal material 50, the seal material 50 can be extended before being cured by the slope at the time of the electronic control unit 1 being assembled. In other words, in equipment which applies the seal material 50 to an application track matching the seal groove structure 2, the application speed can be made constant by this slope and a manufacturing facility becomes simple.

EXAMPLE 3

A third example of the present invention will be described with reference to FIG. 6A, FIG. 6B, and FIG. 6C. FIG. 6A, FIG. 6B, and FIG. 6C are partial cross-sectional views illustrating cross sections taken along line IVA-IVA, line IVB-IVB and line IVC-IVC in FIG. 3, as in FIG. 4A, FIG. 4B, and FIG. 4C.

In the joining structure between the base 10 and the cover 20, for example, a base joining surface 11 is provided at the joining portion of the base 10, and the cover 20 has a cover joining surface 21 facing the base joining surface 11 with a gap therebetween, and there is also a surface seal structure in which the base 10 and the cover 20 are joined by the seal material 50 being interposed therebetween. In other words, in this example, opposing surfaces facing each other (base joining surface 11 and cover joining surface 21) are configured in the joining portion between the base 10 and the cover 20, and the gap between the base joining surface 11 and the cover joining surface 21 is filled with the seal material 50. In this example, the groove 2 and the ridge 3 are not formed on the joining portion between the base 10 and the cover 20. The invention is also applicable in such a case.

In this example, in order to make the sectional area of the seal material 50 at a position which is close to the fixing portions 12 and 23 smaller than the sectional area of the seal material 50 at a position which is away from the fixing portions 12 and 23, the gap between the base joining surface 11 and the cover joining surface 21 is narrowed in the vicinity of the fixing portions 12 and 23 of the base 10 and the cover 20. Accordingly, the thickness of the seal material 50 is decreased and the amount of the seal material 50 in the vicinity of the fixing portions can be reduced.

Specifically, in the seal structure 100C at a position which is closest to the fixing portions 12 and 23, the gap Gc is the smallest among the three seal structures 100A, 100B, and 100C. In the seal structure 100A at a position which is farthest from the fixing portions 12 and 23, the gap Ga is the largest among the three seal structures 100A, 100B, and 100C. In the seal structure 100B in which the distance from the fixing portions 12 and 23 is intermediate between the seal structure 100A and the seal structure 100C, the gap Gb is an intermediate size between the gap Ga of the seal structure 100A and the gap Gc of the seal structure 100C. In this case, the sizes of the gaps Ga, Gb, and Gc are equal to the thickness of the seal material 50 which is filled in the gaps Ga, Gb, and Gc. In other words, the gap (thickness of seal material 50) has a relationship of Gc<Gb<Ga.

In addition, in the seal structure 100C at a position which is closest to the fixing portions 12 and 23, the height Hf of the base joining surface 11 is the highest among the three seal structures 100A, 100B, and 100C. In the seal structure 100A at a position which is farthest from the fixing portions 12 and 23, the height Hd of the base joining surface 11 is the lowest among the three seal structures 100A, 100B, and 100C. In the seal structure 100B in which the distance from the fixing portions 12 and 23 is intermediate between the seal structure 100A and the seal structure 100C, the height He of the base joining surface 11 is an intermediate height between the height Hd in the seal structure 100A and the height Hf in the seal structure 100C.

In this example, the widths Wg, Wh, and Wi of the seal material 50 in the seal structures 100A, 100B, and 100C are set to the same size. However, since the flow of the seal material 50 is not regulated, a slight change is generated between the widths Wg, Wh, and Wi.

EXAMPLE 4

A fourth example according to the invention will be described using FIG. 7A, FIG. 7B, and FIG. 7C. FIG. 7A, FIG. 7B, and FIG. 7C are partial cross-sectional views illustrating cross sections taken along line IVA-IVA, line IVB-IVB, and line IVC-IVC in FIG. 3, as in FIG. 4A, FIG. 4B and, FIG. 4C.

In this example, as in the Example 3, opposing surfaces facing each other (base joining surface 11 and cover joining surface 21) are configured in the joining portion between the base 10 and the cover 20, and the gap between the base joining surface 11 and the cover joining surface 21 is filled with the seal material 50. In this example, the groove 2 and the ridge 3 are not formed on the joining portion between the base 10 and the cover 20. In this example, the seal sectional area is the sectional area (cross-sectional area) of the seal material 50 formed on the gap between the seal joining surface 11 and the cover joining surface 21.

In the surface seal structure of this example, in order to make the sectional area of the seal material 50 at a position which is close to the fixing portions 12 and 23 smaller than the sectional area of the seal material 50 at a position which is away from the fixing portions 12 and 23, the width of the seal material 50 in the vicinity of the fixing portions 12 and between the base 10 and the cover 20 is narrowed. Accordingly, the amount of the seal material 50 in the vicinity of the fixing portions 12 and 23 can be reduced. The sizes of the gaps Ga, Gb, and Gc are the same.

Specifically, in the seal structure 100C at a position which is closest to the fixing portions 12 and 23, a seal material width Wi is the narrowest among the three seal structures 100A, 100B, and 100C. In the seal structure 100A at a position which is farthest from the fixing portions 12 and 23, a seal material width Wg is the largest among the three seal structures 100A, 100B, and 100C. In the seal structure 100B in which the distance from the fixing portions 12 and 23 is intermediate between the seal structure 100A and the seal structure 100C, a seal material width Wh is an intermediate size between the seal material width Wg of the seal structure 100A and the seal material width Wi of the seal structure 100C. In this example, since the sizes of the gaps Ga, Gb, and Gc are the same, the thicknesses of the seal material 50 filled in the gaps Ga, Gb, and Gc are also the same. In other words, the seal material width has a relationship of Wi<Wh<Wg.

For example, a liquid seal material 50 may be used as the seal material 50. In this case, after the seal material 50 is applied to one of the base 10 or the cover 20, the seal material 50 is extended by the other thereof being assemble and thus the width of the seal material 50 is determined. In a case where this example is realized by the equipment described above, the width of the seal material 50 can be changed by only the speed of applying the seal material 50 being changed.

Both this example and Example 3 may be combined to change both the gaps Ga, Gb, and Gc and the seal material widths Wg, Wh, and Wi.

EXAMPLE 5

A fifth example according to the invention will be described using FIG. 8A, FIG. 8B, and FIG. 8C. FIG. 8A, FIG. 8B, and FIG. 8C are partial cross-sectional views illustrating cross sections taken along line IVA-IVA, line IVB-IVB, and line IVC-IVC in FIG. 3, as in FIG. 4A, FIG. 4B and FIG. 4C.

In this example, as in Example 3, opposing surfaces facing each other (base joining surface 11 and cover joining surface 21) are configured in the joining portion between the base 10 and the cover 20, and the gap between the base joining surface 11 and the cover joining surface 21 is filled with the seal material 50. In this example, the groove 2 and the ridge 3 are not formed on the joining portion between the base 10 and the cover 20. In this example, the seal sectional area is the sectional area (cross-sectional area) of the seal material 50 formed on the gap between the seal joining surface 11 and the cover joining surface 21.

Furthermore, in the surface seal structure of this example, for example, cover joining surface recesses 22a, 22b, and 22c forming a groove are provided along the seal portion of the cover joining surface 23. In order to make the sectional area of the seal material 50 at a position which is close to the fixing portions 12 and 23 smaller than the sectional area of the seal material 50 at a position which is away from the fixing portions 12 and 23, the sectional area of the cover joining surface recesses 22 in the vicinity of fixing portions 12 and 23 is decreased. Accordingly, the amount of the seal material 50 in the vicinity of the fixing portions 12 and 23 can be reduced.

Specifically, in the seal structure 100C at a position which is closest to the fixing portions 12 and 23, the sectional area of the recess 22c is the smallest among the three seal structures 100A, 100B, and 100C. In the seal structure 100A at a position which is farthest from the fixing portions 12 and 23, the sectional area of the recess 22a is the largest among the three seal structures 100A, 100B, and 100C. In the seal structure 100B in which the distance from the fixing portions 12 and 23 is intermediate between the seal structure 100A and the seal structure 100C, the sectional area of the recess 22b is an intermediate size between the sectional area of the recess 22a of the seal structure 100A and the sectional area of the recess 22c of the seal structure 100C. In other words, there is a relationship of the sectional area of the recess 22c<the sectional area of the recess 22b<the cross sectional area of the recess 22a. In this example, the sizes of the gaps Ga, Gb, and Gc and the seal material widths Wg, Wh, and Wi are the same.

The recess 22a, the recess 22b and the recess 22c may be provided on abase joining surface 11 side. Alternatively, the recess 22a, the recess 22b, and the recess 22c may be provided on both of the base joining surface 11 and the cover joining surface 21. In addition, in this example, the recess 22c may not be provided and the sectional area of the recess 22c may be made zero.

As in the first example, this example can also be applied to a case where the mounting environment of the electronic control unit 1 becomes severer than the mounting environment in the related art. In the vicinity of the fixing portions 12 and 23, the sectional area of the cover joining surface recess 22c is decreased or the cover joining surface recess 22c is eliminated, and the cross sectional areas of the cover joining surface recesses 22a and 22b are increased at a portion which is far from the fixing portion. Accordingly, the amount of the seal material 50 is increased only in the surroundings of the portion in which there is a high concern that the seal material 50 is peeled off and which is far from the fixing portions 12 and 23. Accordingly, the increase in the amount of the seal material 50 can be suppressed to a minimum.

The gap Ga, Gb, and Gc and the seal material widths Wg, Wh, and Wi may be changed by any of Example 3 and Example 4 or combination of both Example 3 and Example 4 in this example.

EXAMPLE 6

A sixth example according to the invention will be described using FIG. 9A, FIG. 9B, and FIG. 9C. FIG. 9A, FIG. 9B and FIG. 9C are partial cross-sectional views illustrating cross sections taken along line IXA-IXA, line IXB-IXB and line IXC-IXC in FIG. 3. Only the vicinity of the seal structure is illustrated in FIG. 9B and FIG. 9C. The seal structures 200T and 200U in the peripheral portion of the connector 30 described in this example are combined with the seal structures 100 (100A, 100B, and 100C) of the Example 1 to Example 5 described above to complete the seal structure at the peripheral portion of the housing 60.

The invention can be applied not only to the joining between the base 10 and the cover 20 but also to the joining portion between the connector 30 and the base 10 or the joining portion between the connector 30 and the cover 20. In the seal structure of this example, as illustrated in FIG. 9A, FIG. 9B, and FIG. 9C, the connector housing 31 includes the ridge 3, and the cover 20 includes the seal groove structure 2. In order to make the seal sectional area at a position which is close to the fixing portions 12 and 23 smaller than the seal sectional area at a position which is away from the fixing portions 12 and 23, the groove widths Wk and Wl of portions which are other than in the vicinity of the center portion of the connector housing 31 are further narrowed than the groove width Wj in the vicinity of the center portion thereof. Accordingly, the seal material 50 can be reduced.

Hereinafter, this will be described in detail.

The connector 30 protrudes from the housing 60 at the side 60a side of the housing 60. Therefore, among the outer peripheral surface of the connector 60, the upper surface portion and the side surface portion thereof face the lower surface side (edge surface of opening 20a) of the cover 20 to form a seal structure 200T (200TA, 200TB and 200TC). In addition, among the outer peripheral surface of the connector 60, the lower surface portion thereof faces the upper surface side of the base 10 to form a seal structure 200U.

The seal structure 200T is configured by a seal groove structure (seal groove) 2 formed on the lower surface side of the cover 20 and a ridge 3 formed on the outer peripheral surface of the connector. In addition, the seal structure 200U is configured by an upper surface of a flat portion 10E formed on the edge of the base 10 and the lower surface 30U of the connector facing each other. A gap formed by the seal groove structure 2 and the ridge 3 and a gap formed by the upper surface of the flat portion 10E of the base 10 and the lower surface 30U of the connector are filled with a seal material 50.

Regarding the gap formed by the seal groove structure 2 and the ridge 3, the sectional area of the gap formed on an inside of the groove of the seal groove structure 2 and filled with the seal material 50 is referred to as a seal sectional area as in the examples described above.

In the seal structure 200TC at a position which is closest to the fixing portions 12 and 23, the groove width Wl of the seal groove structure 2 is the narrowest among the three seal structures 200TA, 200TB, and 200TC. In the seal structure 200TA at a position which is farthest from the fixing portions 12 and 23, the groove width Wj is the largest among the three seal structures 200TA, 200TB, and 200TC. In the seal structure 200TB in which the distance from the fixing portions 12 and 23 is intermediate between the seal structure 200TA and the seal structure 200TC, the groove width Wk is an intermediate size between the groove width Wj of the seal structure 200TA and the groove width Wl of the seal structure 200TC. In other words, the groove widths of the seal structures 200TA, 200TB, and 200TC have a relationship of Wl<Wk<Wj.

In this example, the groove depths Dd, De, and Df of the seal structures 200TA, 200TB, and 200TC are the same. In addition, the ridge heights Hg, Hh, and Hi of the seal structures 200TA, 200TB, and 200TC are the same. The groove depths Dd, De, and Df and the ridge heights Hg, Hh, and Hi may be different from each other within a range where the seal sectional area at a position which is close to the fixing portions 12 and 23 is smaller than the seal sectional area at a position which is away from the fixing portions 12 and 23.

In this example (also as in Example 7 to be described below), although the seal structure 200U is configured such that the upper surface of the flat portion 10E formed on the edge of the base 10 faces the lower surface 30U of the connector, the seal groove structure 2 and the ridge 3 can be configured to combine with each other as in the seal structure 100. Incidentally, FIG. 2 illustrates a configuration using the seal groove structure 2 and the ridge 3.

EXAMPLE 7

A seventh example according to the invention will be described using FIG. 10A, FIG. 10B, and FIG. 10C. FIG. 10A, FIG. 10B, and FIG. 10C are partial cross-sectional views illustrating cross sections taken along line IXA-IXA, line IXB-IXB and line IXC-IXC in FIG. 3, as in FIG. 9A, FIG. 9B, and FIG. 9C. The seal structure 200T and 200U of this example are combined with the seal structure 100 (100A, 100B, and 100C) of the Example 1 to Example 5 described above to complete the seal structure at the peripheral portion of the housing 60.

In this example, the connector housing 31 includes the seal groove structure 2, and the cover 20 includes the ridge 3. In order to make the seal sectional area at a position which is close to the fixing portions 12 and 23 smaller than the seal sectional area at a position which is away from the fixing portions 12 and 23, the groove widths Wq and Wr of portions which are other than in the vicinity of the central portion of the connector housing 31 are further narrowed than the groove width Wp in the vicinity of the central portion thereof. Accordingly, the seal material 50 can be reduced. In this example, by the portion where the surface seal structure is common in the related art being set as a groove seal structure, it is possible to reduce the size of the connector housing 31 and shorten the connector pin 32 along with the reduction of the seal material 50.

Hereinafter, this will be described in detail.

In the seal structure 200TC at a position which is closest to the fixing portions 12 and 23, the groove width Wr of the seal groove structure 2 is the narrowest among the three seal structures 200TA, 200TB, and 200TC. In the seal structure 200TA at a position which is farthest from the fixing portions 12 and 23, the groove width Wp is the largest among the three seal structures 200TA, 200TB, and 200TC. In the seal structure 200TB in which the distance from the fixing portions 12 and 23 is intermediate between the seal structure 200TA and the seal structure 200TC, the groove width Wq is an intermediate size between the groove width Wp of the seal structure 200TA and the groove width Wr of the seal structure 200TC. In other words, the groove widths of the seal structures 200TA, 200TB, and 200TC have a relationship of Wr<Wq<Wp.

In this example, the groove depths Dg, Dh, and Di of the seal structures 200TA, 200TB, and 200TC are the same. In addition, the ridge heights Hj, Hk, and Hl of the seal structures 200TA, 200TB, and 200TC are the same. In addition, the ridge widths Ws, Wt, and Wu of the seal structures 200TA, 200TB, and 200TC are the same. The groove depths Dg, Dh, and Di, the ridge heights Hj, Hk, and Hl, and the ridge widths Ws, Wt, and Wu may be made different from each other within a range where the seal sectional area at a position which is close to the fixing portions 12 and 23 is smaller than the seal sectional area at a position which is away from the fixing portions 12 and 23.

EXAMPLE 8

An eighth example according to the invention will be described using FIG. 11 and FIG. 12. FIG. 11 is an enlarged view of a seal material branching portion 51. FIG. 12 is a view of the periphery illustrated in FIG. 11 as viewed from the upper surface side.

In the case where there are three or more members forming the space of the inside portion of the housing such as the base 10, the cover 20, and the connector 30, for example, there is a case where the seal material 50 has the seal material branching portion 51 as illustrated in FIG. 11. Since peeling of the seal material 50 is likely to be generated in such a portion 51, the waterproof reliability can be maintained by keeping the width Wv of the seal groove structure 2 in this portion wide.

In each of the examples described above, in a case where the ridge height, the ridge width, the groove width, the groove depth, the seal material width, or the seal material thickness is changed, it is preferable to connect between large size portions and small size portions by a slope surface. In a case where the liquid seal material 50 is used, the seal material 50 can be extended by this slope surface.

The invention includes various modification examples without being limited to the examples described above. For example, the examples described above have been described in detail in order to explain the invention in an easy-to-understand manner, and are not necessarily limited to those including all the configurations. In addition, it is possible to replace a portion of the configuration of one example with the configuration of another example, and in addition, the configuration of another example can be added to the configuration of one example. In addition, it is possible to add, delete, and replace other configurations with respect to a portion of the configuration of each example.

REFERENCE SIGNS LIST

1 . . . electronic control unit, 2 seal groove structure, 3 . . . ridge, 10 . . . base, 10E . . . flat portion formed on periphery of base, 11 . . . base joining surface, 12 . . . cover fixing hole, 13 . . . bracket portion, 20 . . . cover, 21 . . . cover joining surface, 22 . . . cover joining surface recess, 23 . . . heat caulking portion, 30 . . . connector, 31 . . connector housing, 32 . . . connector pin, 40 . . . circuit board, 41 . . . insulating board, 42 . . . electronic component, 50 . . . seal material, 51 . . . seal material branching portion, 70 . . . gap, 100, 100A, 100B, and 100C . . . seal structure, 200, 200T, 200TA, 200TB, 200TC, 200U . . . seal structure.

The invention claimed is:
1. An electronic control device, comprising:
a housing which is joined by a plurality of members and of which a peripheral portion is configured by a plurality of sides;
a circuit board which is accommodated in an inside of the housing; and
a seal structure which is disposed on the peripheral portion along the sides, wherein
a liquid seal material is applied to the seal structure and cured so as to connect between the plurality of members, and wherein a seal sectional area in an end portion of a side is smaller than that in a central portion of the side in the seal structure which is disposed on the side of the peripheral portion.

2. The electronic control device according to claim 1, wherein a seal groove is provided in one of a pair of members which is joined to each other and a ridge is provided on the other of the pair of members in the seal structure, and
wherein a gap between the ridge which is fitted into the seal groove and the seal groove is filled with the seal material.

3. The electronic control device according to claim 2, wherein the housing includes a fixing point to which the plurality of members are fixed at an end portion of the side, and
wherein the seal sectional area in the end portion of the side is smaller than that in the central portion of the side by the width of the seal groove being narrowed at the end portion of the side in the seal structure.

4. The electronic control device according to claim 2, wherein the housing includes a fixing point to which the plurality of members are fixed at the end portion of the side, and
wherein the seal sectional area in the end portion of the side is smaller than that in the central portion of the side by the depth of the seal groove being shallowed at the end portion of the side in the seal structure.

5. The electronic control device according to claim 3, wherein the depth of the seal groove is shallowed at the end portion of the side in the seal structure.

6. The electronic control device according to claim 2, wherein the housing includes a fixing point to which the plurality of members are fixed at an end portion of the side, and
wherein the seal sectional area in the end portion of the side is smaller than that in the central portion of the side by the width of the ridge being widen at the end portion of the side in the seal structure.

7. The electronic control device according to claim 2, wherein the housing includes a fixing point to which the plurality of members are fixed at an end portion of the side, and
wherein the seal sectional area in the end portion of the side is smaller than that in the central portion of the side by the height of the ridge being increased at the end portion of the side in the seal structure.

8. The electronic control device according to claim 6, wherein the height of the ridge is increased at the end of the side in the seal structure.

9. The electronic control device according to claim 1, wherein a first surface which is provided on one of a pair of members joined to each other and a second surface which is provided on the other of the pair of members are provided to face each other, with a gap therebetween, in the seal structure, and
wherein the gap is filled with the seal material.

10. The electronic control device according to claim 9, wherein the housing includes a fixing point to which the plurality of members are fixed at an end portion of the side, and
wherein the seal sectional area in the end portion of the side is smaller than that in the central portion of the side by the height of the seal material being decreased at the end portion of the side in the seal structure.

11. The electronic control device according to claim 9, wherein the housing includes a fixing point to which the plurality of members are fixed at an end portion of the side, and
wherein the seal sectional area in the end portion of the side is smaller than that in the central portion of the side by the width of the seal groove being narrowed at the end portion of the side in the seal structure.

12. The electronic control device according to claim 9, wherein the housing includes a fixing point to which the plurality of members are fixed at an end portion of the side,
wherein the seal structure includes a recess in at least one of the first surface and the second surface, and
wherein the seal sectional area in the end portion of the side is smaller than that in the central portion of the side by a cross-sectional area of the recess being decreased at the end portion of the side.

13. The electronic control device according to claim 1, further comprising bracket portions provided on a side of the base, wherein
the end portion of the side is at a first location immediately adjacent to the bracket portions and is smaller than a seal sectional area at a second location which is disposed farther from the bracket portions than the first location.

14. A method for sealing an electronic control device, the method comprising:
providing a housing, the housing having a plurality of members and of which a peripheral portion is configured by a plurality of sides;
providing a circuit board which is accommodated in an inside of the housing;
providing a seal structure which is disposed on the peripheral portion along the sides;
configuring the seal structure which is disposed on a side of the peripheral portion so that a seal sectional area in an end portion of the side is smaller than that in a central portion of the side;
applying a liquid seal material to the seal structure;
joining the plurality of members; and
curing the seal material.

15. The method according to claim 14, further comprising providing bracket portions provided on a side of the base, wherein the seal sectional area is in a first location immediately adjacent to the bracket portions to be smaller than a seal sectional area in a second location which is disposed farther from the bracket portions than the first location.

* * * * *